United States Patent
Tanaka et al.

(10) Patent No.: US 8,400,751 B2
(45) Date of Patent: Mar. 19, 2013

(54) AIR CURRENT GENERATING APPARATUS AND METHOD FOR MANUFACTURING SAME

(75) Inventors: Motofumi Tanaka, Yokohama (JP); Kazuo Hayashi, Fujisawa (JP); Naohiko Shimura, Atsugi (JP); Hiroyuki Yasui, Yokohama (JP); Masahiro Asayama, Yokohama (JP); Yutaka Ishiwata, Zushi (JP); Masahiro Katayama, Chofu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 61 days.

(21) Appl. No.: 13/007,323

(22) Filed: Jan. 14, 2011

(65) Prior Publication Data

US 2011/0198312 A1 Aug. 18, 2011

Related U.S. Application Data

(63) Continuation of application No. PCT/JP2009/003356, filed on Jul. 16, 2009.

(30) Foreign Application Priority Data

Jul. 17, 2008 (JP) .................................. 2008-186480

(51) Int. Cl.
*H01T 23/00* (2006.01)
(52) U.S. Cl. ........................................................ 361/230
(58) Field of Classification Search .................... 361/230
See application file for complete search history.

(56) References Cited

U.S. PATENT DOCUMENTS

| 3,751,715 A * | 8/1973 | Edwards ........................ 361/230 |
| 6,504,308 B1 | 1/2003 | Krichtafovitch et al. |
| 6,620,224 B1 * | 9/2003 | Sato .................................. 96/83 |
| 2003/0090209 A1 | 5/2003 | Krichtafovitch et al. |
| 2005/0200289 A1 | 9/2005 | Krichtafovitch |
| 2007/0247076 A1 | 10/2007 | Fujioka et al. |
| 2008/0105538 A1 | 5/2008 | Winterhalter et al. |

FOREIGN PATENT DOCUMENTS

| JP | 2003-511640 | 3/2003 |
| JP | 2007-317656 | 12/2007 |
| JP | 2008-1354 | 1/2008 |
| JP | 2008-16222 | 1/2008 |
| JP | 2008-66135 | 3/2008 |
| JP | 2008-117777 | 5/2008 |
| WO | WO 2006/070838 A1 | 7/2006 |

OTHER PUBLICATIONS

International Preliminary Report on Patentability and Written Opinion issued Feb. 17, 2011, in Patent Application No. PCT/JP 2009/003356.
International Search Report issued Oct. 6, 2009 in PCT/JP2009/003356 filed Jul. 16, 2009 (with English Translation).
Written Opinion issued Oct. 6, 2009 in PCT/JP2009/003356 filed Jul. 16, 2009.

* cited by examiner

*Primary Examiner* — Stephen W Jackson
(74) *Attorney, Agent, or Firm* — Oblon, Spivak, McClelland, Maier & Neustadt, L.L.P.

(57) ABSTRACT

In one embodiment, an air current generating apparatus includes: a dielectric substrate exposed to gas: a first electrode disposed inside the dielectric substrate; a second electrode disposed near a surface of the dielectric so as to correspond the first electrode and having a sharp shape; and a power source applying a voltage between the first and second electrodes and plasmatizing part of the gas to generate an air current.

10 Claims, 24 Drawing Sheets

(a)

(b)

AIR CURRENT GENERATING APPARATUS AND METHOD FOR MANUFACTURING SAME

CROSS-REFERENCE TO RELATED APPLICATIONS

This application is a continuation of prior International Application No. PCT/JP2009/003356, filed on Jul. 16, 2009 which is based upon and claims the benefit of priority from Japanese Patent Application No. 2008-186480, filed on Jul. 17, 2008; the entire contents of all of which are incorporated herein by reference.

FIELD

Embodiments described herein relate generally to an air current generating apparatus and a method for manufacturing the same.

BACKGROUND

In view of energy saving, lowering motive power in fluid apparatuses and fluid apparatus systems is becoming more and more important. Alleviating vibration and noise ascribable to the fluid apparatuses and the fluid apparatus systems is also very important in view of securing safety and improving work environments in plants.

The inventors studied a phenomenon that plasmatizing part of a fluid makes it possible to control a flow. As a result, the inventors invented an air current generating apparatus generating an air current by the action of plasma and confirmed its effect.

This air current generating apparatus is capable of generating a very thin laminar flow on a flat plate while appropriately controlling the flow. As a result, it is possible to realize such a control of the air current as to vary velocity distribution on a boundary layer of the flow, forcibly change the flow from a laminar flow to a turbulent flow, and generate/eliminate a vortex. This air current generating apparatus is usable as an innovative element technique of various kinds of industrial apparatuses.

A conventional air current generating apparatus generally has the following structure. Specifically, on a first dielectric (insulating plate), a first electrode (counter electrode) in a strip shape is disposed via an adhesive. On the first electrode, a second dielectric (insulating plate) is disposed via an adhesive. On the second dielectric, a second electrode (discharge electrode) having the same shape as that of the first electrode (counter electrode) and having long sides parallel to long sides of the first electrode (counter electrode) is disposed via an adhesive.

A voltage of, for example, about 1 to 10 kV is applied between the discharge electrode and the counter electrode of the air current generating apparatus. Accordingly, air near the second dielectric between these electrodes is ionized and then an air current flowing from the discharge electrode toward the counter electrode is generated along a surface of the second insulating plate.

However, such a conventional air current generating apparatus has the following problems.

Firstly, in the conventional air current generating apparatus, when the discharge electrode is a thin plate-shaped electrode, bonded surfaces of the discharge electrode and the dielectric are likely to peel off from each other as time passes.

The peeling of the discharge electrode may possibly cause the ignition of a discharge in a gap between the peeled portions, resulting in a power loss, or may possibly impair uniformity of an induced air current due to the occurrence of an accidental induced air current, resulting in deterioration in air current control efficiency.

Further, as for the counter electrode, bonded surfaces of the counter electrode and the dielectric are likely to peel off from each other as time passes. This, as a result, may possibly cause a power loss due to the ignition of a discharge in a gap between the peeled portions, or deteriorate dielectric strength of the dielectric due to heat generation, leading to dielectric breakdown.

Secondly, in the air current generating apparatus, in order to form a desired high space-field intensity on a counter electrode-side edge portion of the discharge electrode, thickness uniformity and shape precision are required of the discharge electrode, and high flatness is also required of the surface of the dielectric on which the air current flows. However, the conventional air current generating apparatus is manufactured by a stacking method using an adhesive. This makes it difficult to ensure the precision in the thickness and shape of the electrode and the flatness of the surface of the dielectric.

Thirdly, in the conventional air current generating apparatus, an accidental discharge in a reverse direction is likely to be ignited on an edge portion, of the discharge electrode, on a side distant from the counter electrode. This may possibly cause the generation of an air current from this edge portion in the reverse direction and may possibly impair uniformity of an induced air current, resulting in deterioration in air current control efficiency.

Fourthly, in the conventional air current generating apparatus, an induced air current is obtained at a predetermined velocity in a direction along the surface of the dielectric. However, in the conventional air current generating apparatus, it is difficult for the velocity of the induced air current to have distribution along a longitudinal direction of the discharge electrode and for an induced air current to be generated in a direction perpendicular to the surface of the dielectric.

Fifthly, in the conventional air current generating apparatus, there sometimes occur concavity/convexity and disturbance of an electric field near a portion, of the discharge electrode or the counter electrode, connected to a high-voltage cable. This is likely to deteriorate air current control efficiency due to the disturbance of the induced air current.

Sixthly, in order to complicatedly control the air current on an object surface by the conventional air current generating apparatus, it is necessary to arrange a plurality of the air current generating apparatuses on the object surface and control them simultaneously. This requires a power source, a switching circuit, and a control device which are complicated and large-scaled. There is also a concern that air current control efficiency may deteriorate due to the interference of electric fields formed by a plurality of electrodes.

Seventhly, the conventional air current generating apparatus also has problems from a practical viewpoint, such as high manufacturing cost of the electrodes, inferior durability, and easiness of the occurrence of electric noise.

DETAILED DESCRIPTION

Figure 1A:
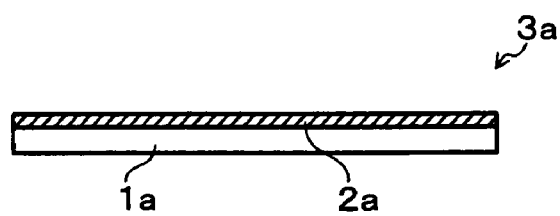
FIG. 1A is a view showing a method for forming a discharge electrode of an air current generating apparatus in a first example of a first embodiment.

In one embodiment, an air current generating apparatus includes: a dielectric substrate exposed to gas; a first electrode disposed inside the dielectric substrate; a second electrode disposed near a surface of the dielectric substrate so as to correspond to the first electrode and having a sharp shape; and a power source applying a voltage between the first and second electrodes and plasmatizing part of the gas to generate an air current. A portion in the sharp shape may be exposed from the surface of the dielectric substrate or may be covered by a thin dielectric or the like.

Examples of the sharp electrode shape are a shape having irregularities on its tip, such as a saw-tooth shape or a trapezoidal shape, and a thin-blade shape such as a knife-edge.

Further, the first electrode (counter electrode) may be composed of a plurality of strip-shaped electrodes, with intervals therebetween being gradually changed. Field intensity, and as a result, velocity of the air current, can be changed in a longitudinal direction of the electrode.

Further, the second electrode may have a plurality of electrodes that are arranged so as to cause an area having high field intensity to be formed all along a predetermined direction when the voltage is applied. It is possible to form a steady flow of an air current in a wide area. In this case, the plural electrodes can be disposed in parallel.

Further, the second electrode may have a plurality of electrodes, and the plural electrodes may be arranged so as to cause opposed air currents to be generated between the plural electrodes when the voltage is applied and join with each other to become an air current having a vertical component from the surface of the dielectric substrate. Incidentally, it is possible to control the direction and velocity of the air current by controlling the timings at which a high voltage is applied to the respective electrodes.

Forming the dielectric substrate of a piezoelectric material makes it possible to interpose a piezoelectric element between the electrodes and give oscillation to the air current. It is also possible to prevent a noise trouble by a conductor mesh covering tops of the electrodes and gaps between the electrodes.

A method for manufacturing an air current generating apparatus according to a first embodiment is a method for manufacturing an air current generating apparatus which includes: a dielectric substrate exposed to gas; a first electrode disposed inside the dielectric substrate; and a second electrode disposed near a surface of the dielectric substrate so as to correspond to the first electrode, and which applies a voltage between the first and second electrodes and plasmatizes part of the gas to generate an air current, the method including: preparing a conductor-clad dielectric plate including a dielectric plate having a first and a second principal surface and a conductive layer disposed on the first principal surface; and forming the first or second electrode by etching the conductive layer.

A method for manufacturing an air current generating apparatus according to a second embodiment is a method for manufacturing an air current generating apparatus which includes: a dielectric substrate exposed to gas; a first electrode disposed inside the dielectric substrate; and a second electrode disposed near a surface of the dielectric substrate so as to correspond to the first electrode, and which applies a voltage between the first and second electrodes and plasmatizes part of the gas to generate an air current, the method including: forming a pattern of the first or second electrode on a principal surface of an unbaked ceramics plate by using a conductive paste; and forming a ceramics plate having the first or second electrode by baking the unbaked ceramics plate.

A method for manufacturing an air current generating apparatus according to a third embodiment is a method for manufacturing an air current generating apparatus which includes: a base member; a first electrode disposed on the base member; a dielectric layer covering the first electrode and exposed to gas; and a second electrode disposed on the dielectric layer or near a surface of the dielectric layer so as to correspond to the first electrode, and which applies a voltage between the first and second electrodes and plasmatizes part of the gas to generate an air current, the method including forming at least one of the first and second electrodes and the dielectric layer on the base member by using a coating process.

In the manufacturing method of the first embodiment, the air current generating apparatus is manufactured as follows, for instance. Specifically, a surface of an organic or inorganic dielectric plate whose surface is smoothed is covered with a conductive layer by sputtering, vapor deposition, or the combination of electroless plating and electrolytic plating, whereby the conductor-clad dielectric plate is formed. A predetermined electrode is formed by etching the conductive layer, whereby the air current generating apparatus is manufactured.

As the dielectric plate, an organic dielectric or inorganic dielectric in a sheet form is usable. Examples of the organic dielectric are a thermoplastic polyimide-based resin film, a prepreg in which glass cloth or mica is impregnated with epoxy-based resin or phenol resin, carbon FRP (fiber reinforced plastic), and glass FRP. Examples of the inorganic dielectric are aluminum nitride and alumina.

Here, it is possible to stack and integrate a reinforcing plate on and with the conductor-clad dielectric plate on which the first or second electrode is formed. For example, a conductor plate such as a copper foil and a dielectric sheet material (for example, a polyimide-based resin film or a prepreg) are stacked and integrated by hot pressing. At this time, the conductor plate may be disposed either on one surface or both surfaces of the sheet material. Next, the conductor plate is etched, whereby a predetermined electrode pattern is formed.

As a method for integrating the conductor plate and the dielectric sheet material, a method capable of ensuring strength of bonded surfaces, such as vapor deposition, sputtering, plating, or brazing is selectable, instead of the hot pressing.

The dielectric substrate having the first and second electrodes can be formed as follows, for instance. Specifically, a first and a second conductor-clad dielectric plate having a first and a second electrode pattern respectively are formed. The first and second conductor-clad dielectric plates are stacked so that the first and second electrode patterns are in a predetermined positional relation, and they are integrated by hot pressing.

An alternative method for forming the dielectric substrate having the first and second electrode can be as follows, for instance. Specifically, a double-sided conductor-clad dielectric plate having the first and second electrode patterns on both surfaces is formed. This double-sided conductor-clad dielectric plate and a reinforcing plate are stacked and integrated.

In the manufacturing method of the second embodiment, the air current generating apparatus is manufactured as follows, for instance. Specifically, on sheets each made of an unbaked ceramics material, predetermined electrode patterns are formed of an inorganic conductive paste or the like by screen printing, plating, or the like. These unbaked ceramics materials are stacked and baked.

Hereinafter, an air current generating apparatus according to embodiments and methods for manufacturing the same will be described with reference to the drawings.

First Embodiment

As a first embodiment, a method for forming a discharge electrode of the air current generating apparatus will be hereinafter described. FIG. 1A to FIG. 1D show a first example of the method for forming the discharge electrode 4a according to this embodiment.

Figure 1B:
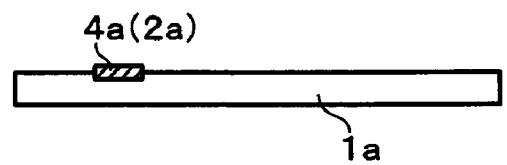
FIG. 1B is a view showing the method for forming the discharge electrode of the air current generating apparatus in the first example of the first embodiment.

First, a single-sided conductor-clad insulating plate 3a is prepared (FIG. 1A). A method for forming the single-sided conductor-clad insulating plate 3a is, for example, to stack a conductor (for example, copper) foil 2a on one surface of a dielectric (for example, polyimide-based resin) 1a in a sheet form and integrate them by hot pressing. Next, the discharge electrode 4a is formed by an etching process of the conductor foil 2a (FIG. 1B).

Figure 1C:
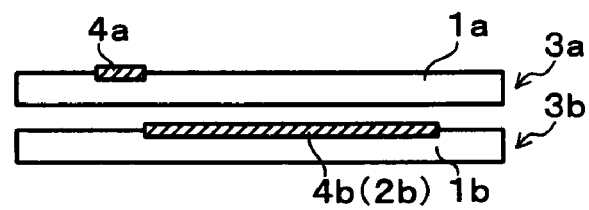
FIG. 1C is a view showing the method for forming the discharge electrode of the air current generating apparatus in the first example of the first embodiment.

Next, a single-sided conductor-clad insulating plate 3b is prepared. A method for forming the single-sided conductor-clad insulating plate 3b is to stack a conductor foil on one surface of a dielectric 1b in a sheet form of the same kind as the dielectric 1a and integrate them by hot pressing. The dielectrics 1a, 1b collectively are a dielectric 1, which functions as a dielectric substrate. A counter electrode 4b is formed by an etching process of this conductor foil (FIG. 1C). Hereinafter, the counter electrode 4b covered by the insulator will be referred to as a "covered electrode 4b".

Figure 1D:
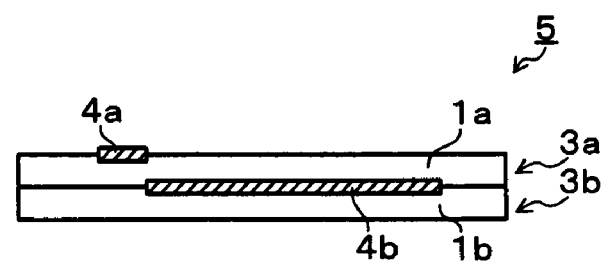
FIG. 1D is a view showing the method for forming the discharge electrode of the air current generating apparatus in the first example of the first embodiment.

Next, the single-sided conductor-clad insulating plates 3a, 3b are integrated by hot pressing (FIG. 1D). At this time, a surface, of the single-sided conductor-clad insulating plate 3a, on which the discharge electrode 4a is not formed and a surface, of the single-sided conductor-clad insulating plate 3b, on which the counter electrode 4b is formed are joined. Consequently, the discharge electrode 4a integrated on a front surface of the dielectric 1 is formed and the covered electrode 4b is prevented from peeling off from the dielectric.

The air current generating apparatus of this example is capable of applying a 1 to 10 kV voltage between the discharge electrode 4a and the covered electrode 4b through a high-voltage cable, not shown. As a result, an induced air current flowing from the discharge electrode 4a toward the covered electrode 4b can be generated on the front surface of the dielectric 1a.

In this example, it is possible to easily form even a very thin and minute discharge electrode and to manufacture an air current generating apparatus 5 having high efficiency and high controllability. The dielectrics 1a, 1b in the sheet form and the conductive foils 2a, 2b are firmly bonded and integrated by hot pressing. Further, since the entire air current generating apparatus is smoothed so as to have a uniform thickness, it is possible to induce a stable air current. Further, since various kinds of the air current generating apparatuses 5 can be formed from the conductor-clad insulating plates 3a, 3b which are mass-produced, manufacturing cost can be reduced to low.

Incidentally, prior to the integration process of the single-sided conductor-clad insulating plates 3a, 3b, a pre-process for adhesiveness improvement may be applied to bases of the dielectrics 1a, 1b. For example, a sputtering process, a peeling process, an acid process, and the like can be applied to the bases. In this manner, it is possible to remove impurities adhering to the bases, make the surfaces irregular, and change part of material qualities of the surfaces. As a result, the firmer integration is enabled.

The dielectrics 1a, 1b in the sheet form and the conductor foils 2a, 2b may be integrated only by themselves or may be integrated after an adhesive such as resin is sandwiched therebetween. Blending a flame-retardant adhesive in the adhesive makes it possible to avoid a burnout even if dielectric breakage occurs at the time of the voltage application. It is sometimes expected that the flame-retardant adhesive may melt due to an ultra-high temperature. In this case, the use of a halogen-free flame-retardant adhesive is desirable in order to reduce an environmental load.

Here, for integrating the dielectrics 1a, 1b in the sheet form and the conductor foils 2a, 2b, methods other than the hot pressing are usable. A method capable of achieving adhesion equivalent to that achieved by the hot pressing, such as vapor deposition or sputtering of the conductors to the insulating plates may be used for the integration. For example, the air current generating apparatus can be manufactured as follows, for instance. Specifically, a surface of an organic or inorganic dielectric plate whose surface is smoothed is covered by a conductor layer, whereby the conductor-clad dielectric plate is formed. The conductor layer can be formed by sputtering, vapor deposition, the combination of electroless plating and electrolytic plating, or the like. Thereafter, predetermined electrodes are formed by etching the conductor layers, whereby the air current generating apparatus is formed.

As the dielectric 1a in this example, the use of a thermoplastic polyimide-based resin film is possible. Other alternatives that may be employed as the dielectric 1a are an organic dielectric (for example, a prepreg in which glass cloth or mica is impregnated with epoxy-based rein or phenol resin, carbon FRP (fiber reinforced plastic), or glass FRP), an inorganic dielectric such as aluminum nitride or aluminum, and the like which are in a sheet form may be employed.

In particular, when the prepreg or FRP is used as the dielectric, it is possible to give structural strength to the electrode itself and install the electrode as part of a structure requiring a structural strength, such as a wing or a wall of a fluid apparatus. Therefore, an air current generating apparatus usable in wider application is realized.

Especially when aluminum nitride being a highly heat conductive ceramics is used as the dielectric, it is possible to install the electrode as part of a heat exchange member of a heat exchanger or the like. As a result, it is possible to realize a heat exchanger whose heat conductivity is improved by the action of plasma.

As the conductor 2a used for forming the conductive layer of the air current generating apparatus in this example, the use of a copper foil is conceivable. Other preferable materials are usable as the conductor 2a. Examples thereof are inorganic good conductors (metals such as stainless steel, Inconel (product name), Hastelloy (product name), titanium, platinum, and iridium, carbon nanotube, conductive ceramics, and so forth) and organic good conductors (conductive plastic and the like).

Especially the use of a heat-resistant or corrosion-resistant metal such as Inconel, Hastelloy, or titanium as the conductor makes it possible to realize an electrode withstanding a long-term use even in a highly corrosive atmosphere such as a high-temperature and high-humidity atmosphere or an oxidizing atmosphere. Further, the use of conductive plastic instead of metal as the conductor makes it possible not only to greatly reduce manufacturing cost but also to improve workability, so that an air current generating apparatus having a complicated shape such as a complicated curved surface can be realized.

FIG. 2A to FIG. 2D show a second example of this embodiment regarding a method for forming the discharge electrode 4a and the counter electrode 4b.

Figure 2A:
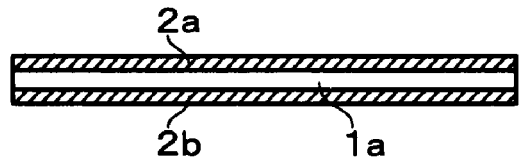
FIG. 2A is a view showing a method for forming the discharge electrode of the air current generating apparatus in a second example of the first embodiment.
Figure 2B:
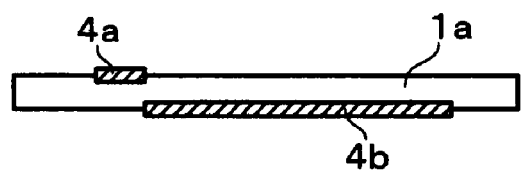
FIG. 2B is a view showing the method for forming the discharge electrode of the air current generating apparatus in the second example of the first embodiment.
Figure 2C:
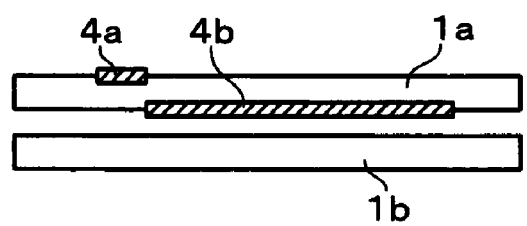
FIG. 2C is a view showing the method for forming the discharge electrode of the air current generating apparatus in the second example of the first embodiment.
Figure 2D:
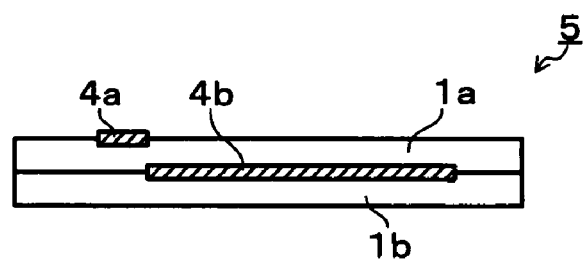
FIG. 2D is a view showing the method for forming the discharge electrode of the air current generating apparatus in the second example of the first embodiment.

In this example, the air current generating apparatus 5 can be manufactured as follows. Specifically, a double-sided conductor-clad insulating plate 6 in which conductor (copper) foils 2a, 2b are stacked on and integrated with both surfaces of a dielectric (polyimide-based resin) 1a in a sheet form is prepared (FIG. 2A). Next, the conductor foils 2a, 2b are etched with parts there being left, whereby the discharge electrode 4a and the counter electrode 4b are formed (FIG. 2B). Further, a dielectric base plate (for example, polyimide-based resin) 1b is stacked on the counter electrode 4b side (FIG. 2C) and is integrated by a method such as hot pressing, whereby the air current generating apparatus 5 is formed (FIG. 2D). The dielectrics 1a, 1b are collectively the dielectric 1, which functions as the dielectric substrate.

That is, in this example, conductor plates such as, for example, copper foils are stacked on a dielectric sheet material such as a polyimide-based resin film or a prepreg and they are integrated by hot pressing. At this time, the conductor plate may be disposed on one surface or on both surfaces of the sheet material.

This method also has the same advantages as those of the forming method of the first example shown in FIG. 1A to FIG. 1D. In addition, using a very thick plate as the base plate 1b facilitates manufacturing an air current generating apparatus with high structural strength.

Forming the air current generating apparatus 5 thus having higher structural strength so that it has a specific curvature facilitates the replacement when it is installed on a surface with a curvature such as a surface of a wing. As a result, improved efficiency in a maintenance work can be achieved.

Here, the method for integrating the conductor plates and the dielectric sheet material is not limited to the hot pressing, but any method capable of ensuring strength of bonded surfaces, such as vapor deposition, sputtering, plating, or brazing is selectable.

Incidentally, the counter electrode can be formed by the following method. Specifically, by the same method as that for forming the discharge electrode, the conductor-clad dielectric plate on which a counter electrode pattern is formed is formed. Then, its counter electrode pattern side is stacked on a rear surface side of a dielectric sheet material on which a discharge electrode pattern is formed, with the both electrode patterns being in a predetermined positional relation, and the conductor-clad dielectric plate and the dielectric sheet material are integrated by hot pressing.

The counter electrode can also be formed by the following method. From a double-sided conductor-clad dielectric plate on whose both surfaces conductors are disposed in an integrated manner, patterns of the counter electrode and the discharge electrode are formed by etching. Further, the resultant structure and a reinforcing plate are stacked and integrated.

FIG. 3A to FIG. 3F show a third example of this embodiment regarding the method for forming the discharge electrode and the covered electrode.

Figure 3A:
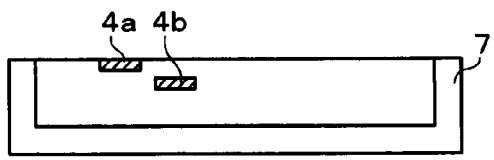
FIG. 3A is a view showing a method for forming the discharge electrode of the air current generating apparatus in a third example of the first embodiment.
Figure 3B:
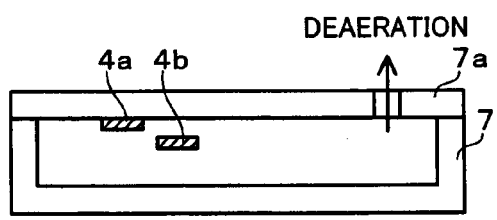
FIG. 3B is a view showing the method for forming the discharge electrode of the air current generating apparatus in the third example of the first embodiment.

In this example, the discharge electrode 4a and the counter electrode 4b are fixed in a predetermined spatial arrangement on a side plate or a bottom plate of a molding die 7 via an electrically insulating support member (not shown) (FIG. 3A). Thereafter, a lid 7a is airtightly put over the molding die 7 and the inside of the molding die 7 is deaerated (FIG. 3B). Incidentally, this deaeration process is not necessary if later-described powder resin is used.

Figure 3C:
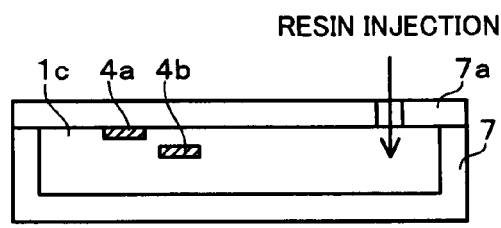
FIG. 3C is a view showing the method for forming the discharge electrode of the air current generating apparatus in the third example of the first embodiment.

Next, the powder resin (for example, acrylic powder resin) or liquid curable resin (for example, epoxy-based resin) 1c is injected into the die 7 (FIG. 3C).

Figure 3D:
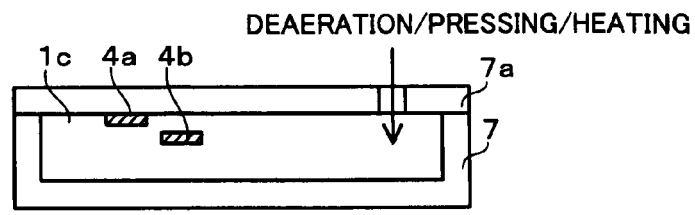
FIG. 3D is a view showing the method for forming the discharge electrode of the air current generating apparatus in the third example of the first embodiment.

Next, the resin 1c is melted by heating. If the powder resin is used as the resin 1c, heating and pressing follow the deaeration to crash down voids present in the powder (FIG. 3D). If the curable resin is used as the resin 1c, the curable resin is cured in this heating process. The cured resin is functions as the dielectric substrate.

Figure 3E:
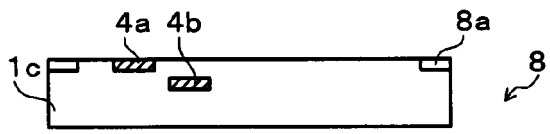
FIG. 3E is a view showing the method for forming the discharge electrode of the air current generating apparatus in the third example of the first embodiment.
Figure 3F:
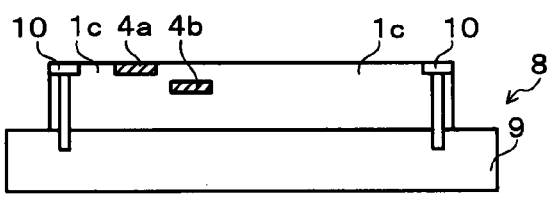
FIG. 3F is a view showing the method for forming the discharge electrode of the air current generating apparatus in the third example of the first embodiment.

Thereafter, a block 8 is released as a cured unit. This unit block 8 is worked into a desired shape by machining or the like (FIG. 3E). Note that stepped portions 8a are for the fixation of bolts 10. Finally, the unit block 8 is fixed to a target object 9 by the bolts 10 or the like (FIG. 3F).

In this example, it is also possible to fabricate the molding die 7 by using engineering plastic or the like and use the die itself as a unit package without being released.

In this example, the air current generating apparatus can be formed in the unit block 8 that is machinable, and therefore, is easily attached as an external apparatus to various kinds of the objects 9.

Figure 4A:
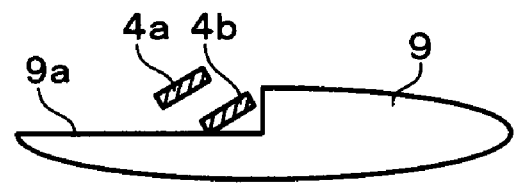
FIG. 4A is a view showing a method for forming the discharge electrode of the air current generating apparatus in a fourth example of the first embodiment.
Figure 4B:
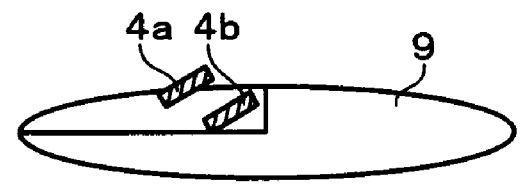
FIG. 4B is a view showing the method for forming the discharge electrode of the air current generating apparatus in the fourth example of the first embodiment.
Figure 4C:
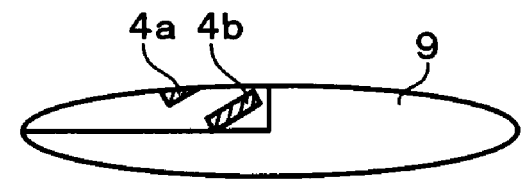
FIG. 4C is a view showing the method for forming the discharge electrode of the air current generating apparatus in the fourth example of the first embodiment.

FIG. 4A to FIG. 4C show a fourth example of this embodiment regarding the method for forming the discharge electrode and the counter electrode.

In this example, a left upper portion of an object 9 which is finally formed to have an elliptic cross section is cut. On this cutout portion 9a, the discharge electrode 4a and the counter electrode 4 which each have a rectangular cross-section are fixed (FIG. 4A). Finally, the discharge electrode 4a and the counter electrode 4b are fixed by an electrically insulating support member (not shown) or the like so that the discharge electrode 4a is exposed.

A resin material which is the same material as that of the object 9 is molded from above this portion (FIG. 4B). For this molding, a publicly known method such as potting or casting is used.

Thereafter, a portion projecting from the object 9 (corner portion of the discharge electrode 4a) is cut and polished by machining, so that the object 9 has a predetermined elliptic cross section (FIG. 4C).

According to this embodiment, it is possible to form the air current generating apparatus without any change in the original shape of the object 9 and without any deterioration in strength or the like.

Figure 5:
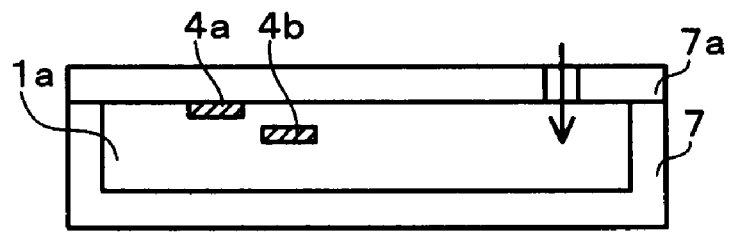
FIG. 5 is a view showing a method for forming the discharge electrode of the air current generating apparatus in a fifth example of the first embodiment.

FIG. 5 shows a fifth example of this embodiment regarding the method for forming the discharge electrode 4a and the counter electrode 4b. In this example, a filler-containing resin 1a in which particles or powders of insulating ceramic such as alumina, silica, or aluminum nitride are added and mixed in a resin is used in the third example of this embodiment shown in FIG. 3A to FIG. 3F.

Concrete manufacturing processes in this example are basically the same as the above-described processes shown in FIG. 3A to FIG. 3F.

In this example, owing to the use of the filler-containing resin, the unit has improved mechanical properties (strength, hardness, and so on) and heat conductivity, and a dielectric constant of the dielectric can be controlled depending on the selection of the filler and the adjustment of its blended amount.

Figure 6:
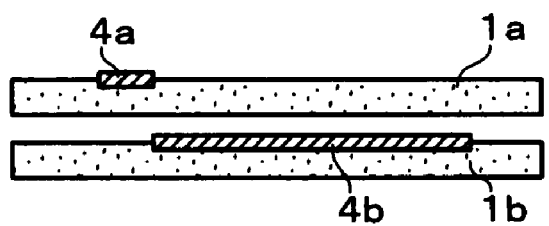
FIG. 6 is a view showing a method for forming the discharge electrode of the air current generating apparatus in a sixth example of the first embodiment.

FIG. 6 shows a sixth example regarding this embodiment in which the dielectric is formed by using a green sheet. In this example, the air current generating apparatus is manufactured as follows. Predetermined electrode patterns (discharge electrode 4a, counter electrode 4b) are formed from an inorganic conductive paste or the like by screen printing, plating, or the like on the dielectrics 1a, 1b in a sheet form made of an unbaked ceramics material. Thereafter, these unbaked ceramics materials are stacked and baked.

As the unbaked ceramics materials, powder of ceramics dielectric such as aluminum nitride or alumina is used. As the sheets, green sheets made of ceramics dielectric powder, a slurry of ceramics dielectric powder that is slip-molded, or the like is used.

After the molded body is baked, a surface of the ceramics dielectric together with the electrode pattern may be polished. It is possible to obtain an air current generating apparatus having a smooth surface and excellent in corrosion resistance.

Applying the above-described method to the manufacture of the air current generating apparatus makes it possible to produce an electrode having a complicated three-dimensional shape such as a wing shape or a streamlined shape with ease and at low cost. It is also possible to precisely control capacitance of the electrode by regulating a sheet thickness. This makes it possible to realize an electrode with very small variation in induced-flow velocity depending on each place and with high uniformity.

Here, a smaller one between a coefficient of linear expansion of ceramics and a coefficient of linear expansion of a conductor used for the pattern is defined as A and the other one is defined as B. At this time, those whose coefficients of linear expansion are in a ratio B/A smaller than 10 are usable (B/A<10). This makes it possible to avoid a small crack of a minute structure in a contact portion between the conductor-ceramics at the time of the baking to maintain longitudinal uniformity of the structure. As a result, uniformity of an induced air current over the whole area can be ensured and a highly efficient air current generating apparatus can be realized.

As a result, it is possible to prevent the discharge from becoming spotted and losing its uniformity due to the formation of a portion locally having a high field intensity at the time of the voltage application, due to a small crack or projection of a minute structure in the contact portion between the conductor-ceramics. Further, even in the use in an environment where the temperature changes during the use, thermal deformation of the contact portion between the conductor-ceramics can also be kept uniform, which can ensure uniformity of an induced air current over the whole area.

Especially when alumina is used as the dielectric, the use of tungsten is effective, and when glass is used as the dielectric, the use of a 42 alloy or Kovar is effective. Further, in the use in a corrosive environment and when it is desired to increase the strength of the electrode, it is effective to attach, on the aforesaid conductor, the same kind of or a different kind of conductor by plating or the like.

FIG. 7A to FIG. 7D show a seventh example of this embodiment where the dielectric is formed by using a coating process such as thermal spraying or EB-PVD (electron beam physical vapor deposition).

Figure 7A:
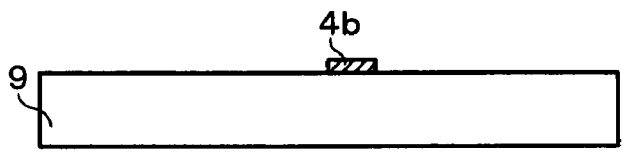
FIG. 7A is a view showing a method for forming the discharge electrode of the air current generating apparatus in a seventh example of the first embodiment.
Figure 7B:
FIG. 7B is a view showing the method for forming the discharge electrode of the air current generating apparatus in the seventh example of the first embodiment.

In this example, the counter electrode 4b is fixed in close contact on a surface of an electrically insulating object 9 to which the apparatus is externally connected (FIG. 7A). Next, a ceramic layer (dielectric 1a) is formed on the counter electrode 4b by thermal spraying or EB-PVD (FIG. 7B).

Here, the aforesaid coating process such as EB-PVD is preferably executed in a vacuum or pressure-reduced atmosphere since the execution in the atmosphere causes the mixture of air, resulting in a porous structure. Further, using ceramics powder having a small particle size as used thermal-spray powder makes it possible to obtain a ceramic layer (dielectric 1a) that is compact and has a high withstand voltage. Further, in the case of thermal spraying, roughening the surface of the electrically insulating object 9 by a blast process or the like prior to the coating makes it possible to improve adhesion strength of the ceramic layer (dielectric 1a).

In the case of the thermal spraying, the formation of a 300 μm film with about a 10 μm thickness per layer is a limit in view of withstand voltage of the deposit. However, in EB-PVD, the film thickness is controllable with a 100 nm precision and a film with about a 1 mm thickness can be formed. Therefore, EB-PVD is capable of more smoothing the deposit surface compared with the thermal spraying.

Forming the counter electrode 4b by a coating process such as thermal spraying or EB-PVD is also effective and makes it possible to cope with a complicated shape.

Figure 7C:
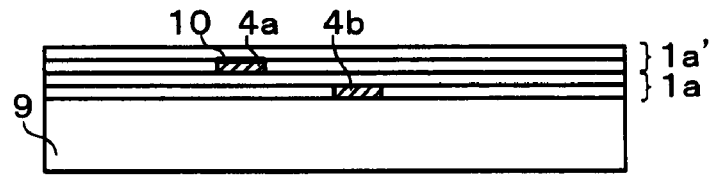
FIG. 7C is a view showing the method for forming the discharge electrode of the air current generating apparatus in the seventh example of the first embodiment.

Next, the discharge electrode 4a is fixed on the dielectric 1a and a ceramic layer (dielectric 1a') is further formed thereon (FIG. 7C). At this time, in forming the ceramic layer, a masking 10 is desirably applied on the discharge electrode 4a. Further, similarly to the case of the counter electrode 4b, forming the discharge electrode 4a by using a coating process such as thermal spraying or EB-PVD makes it possible to cope with a complicated shape.

Figure 7D:
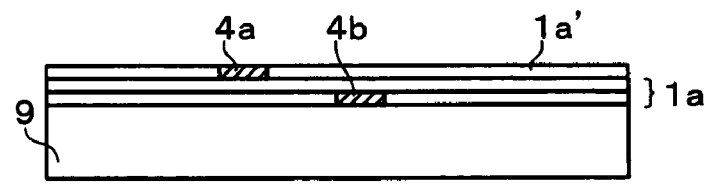
FIG. 7D is a view showing the method for forming the discharge electrode of the air current generating apparatus in the seventh example of the first embodiment.

Finally, the surface is finished into a smooth surface by machining when necessary and the discharge electrode 4a is exposed (FIG. 7D). At this time, the presence of the masking (tape or the like) on the discharge electrode 4a prevents the discharge electrode 4 from being damaged. The object 9 and the dielectrics 1a, 1a' function as the dielectric substrate.

In this embodiment, the installation to a large area is easy and the formation on a surface of a complicatedly shaped object is also possible. Further, compared with the method using the green sheet, there is an advantage that the baking after the installation is not necessary, which can realize a decrease in temperature of the process. For example, in the method using the green sheet, conditions such as the baking temperature and time differ depending on each shape. This makes it difficult for air current generating apparatuses with different shapes having different curvatures to be simultaneously manufactured in a single production line. Further, in the method using the green sheet, in order to enable mass production, it is necessary to simultaneously install a plurality of furnaces in parallel, which results in an increase in facility cost. According to the coating process of this embodiment, only by programming the operation of a coating apparatus, it is possible to simultaneously manufacture air current generating apparatuses with different shapes having different curvatures or the like in a single production line. As a result, a great cost reduction is possible.

Figure 8A:
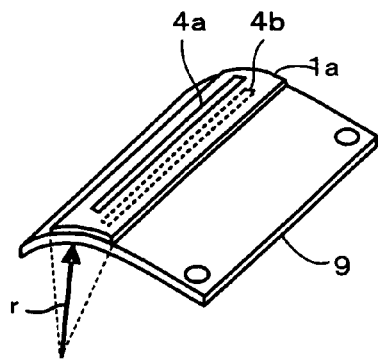
FIG. 8A is a view showing an air current generating apparatus in a modification example of the first embodiment.

FIG. 8A shows an example of the air current generating apparatus manufactured by using a coating process. On an object 9 (base material, base member) having a given curvature r, the counter electrode 4b, the dielectric 1a (dielectric layer), and the discharge electrode 4a are formed in sequence by coating.

Here, one surface of the discharge electrode 4a and a surface of the dielectric 1a are substantially flush with each other. However, the discharge electrode 4a may be provided to project from the surface of the dielectric 1a or may be buried in the dielectric 1a. Further, one surface of the counter electrode 4b and a surface of the dielectric 1a are substantially flush with each other. However, the counter electrode 4b may be disposed to project from the surface of the dielectric 1a or may be buried in the dielectric 1a.

The discharge electrode 4a and the counter electrode 4b are each made of a publicly known solid, conductive material. As the discharge electrode 4a and the counter electrode 4b, copper foils or the like are usable, for instance, but this is not restrictive. As the discharge electrode 4a and the counter electrode 4b, any is selectable according to a use environment, from inorganic good conductors (metals such as stainless steel, Inconel (product name), Hastelloy (product name), titanium, platinum, tungsten, molybdenum, nickel, copper, gold, silver, tin, and chromium, alloys containing any of these metal elements as a main component, carbon nanotube, conductive ceramics, and the like) and organic good conductors (conductive plastic and so on).

Especially when a heat-resistant or corrosion-resistant metal such as Inconel, Hastelloy, or titanium is used as the conductor, it is possible to realize an electrode withstanding a long-term use even in a highly corrosive atmosphere such as a high-temperature and high-humidity atmosphere or an oxidizing atmosphere. Further, using conductive plastic instead of metal as the conductor not only can greatly reduce manufacturing cost but also improves workability, which makes it possible to realize an air current generating apparatus having a complicated shape such as a complicated curved surface.

Figure 8B:
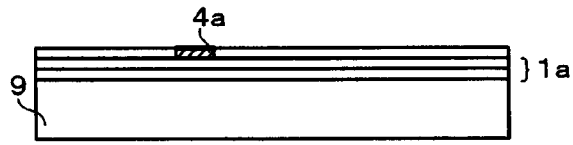
FIG. 8B is a view showing the air current generating apparatus in the modification example of the first embodiment.

The object 9 is made of the same ceramics material as the material of the dielectric 1a. The object 9 can be made of a conductive material similarly to the discharge electrode 4a. In this case, the object 9 can be structured so as to also function as the discharge electrode 4b as shown in FIG. 8B. This can simplify a manufacturing process. Further, since the structure of the air current generating apparatus becomes simple, it is possible to realize an air current generating apparatus high in strength and durability.

The dielectric 1a is made of, for example, a ceramics material whose main component is alumina nitride, alumina, zirconia, hafnia, titania, silica, or the like. In particular, its porosity is preferably 10% or less, more preferably 5% or less. Generally, a dielectric layer formed by the coating process becomes porous and is difficult to ensure withstand voltage. However, limiting the aforesaid porosity can increase withstand voltage of the dielectric 1a.

In order to form a compact layer by thermal spraying or EB-PVD, it is preferable, in the case of the thermal spraying, that molten pulverized powder is used as thermal-spray powder and the thermal-spray powder has an average particle size of 44 µm (325 mesh) or less. Thus, it is possible to form the compact layer made of ceramics by using thermal spraying. A reason why the average particle size of the thermal-spray powder is limited to 44 µm or less is to form the compact layer so that the aforesaid porosity becomes 10% or less. Further, this average particle size is a median diameter of accumulated distribution (cumulative distribution) (particle size when a cumulative amount is 50% in a cumulative distribution curve). Further, the average particle size is measured by a mesh method (sieving), a specific surface area measuring method (BET method), a precipitation method, or the like.

In the case of EB-PVD, the object 9 is installed so that its surface on which the dielectric 1a is to be formed faces a vaporization source. At this time, the object 9 is installed in a stationary state so as not to rotate or the like. Then, the vaporization source is melted and vaporized by electron beam irradiation, and molecules or clusters of a generated vaporization source substance are deposited on the facing surface of the object 9. Further, ionized gas molecules of argon, oxygen, or the like are generated by an ion gun or the like and a plus voltage is applied to the object 9 (base material, base member), thereby forming an electric field. In this electric field, the ionized gas molecules are accelerated and are deposited on the surface of the object 9 with the aforesaid vaporized molecules or clusters, which makes it possible to increase the deposition speed and improve compactness and adhesiveness of the deposit.

The dielectric 1a can also be fabricated in the following manner. For example, a sealer made of a dielectric material is filled in pores of a porous layer made of a ceramics material whose main component is alumina nitride, alumina, zirconia, hafnia, titania, silica, or the like. The pores of the porous layer are impregnated with the sealer to be sealed, whereby the dielectric 1a having high dielectric strength can be formed.

As the sealer, usable are, for instance, epoxy-based resin, Teflon (registered trademark)-based resin, ceramics materials such as alumina in a slurry form, a glass-based material whose main component is silica or the like, a composite material of metal and ceramics, in which the above materials are mixed. When the ceramics material is used, the use of the same material as the ceramics material forming the aforesaid porous layer is preferable.

When epoxy-based resin is used as the sealer, for instance, the pores of the porous layer are impregnated with liquid epoxy-based resin and the resultant is heated to a temperature at which the resin is cured, whereby the dielectric 1a is formed.

When Teflon (registered trademark)-based resin is used as the sealer, for instance, the pores of the porous layer are impregnated with liquid Teflon (registered trademark)-based resin, followed by a baking process, whereby the dielectric 1a is formed. In this case, owing to the baking process, the firm dielectric 1a can be formed.

When the ceramics material is used as the sealer, for instance, the pores of the porous layer are impregnated with a slurry in which fine ceramics particles are suspended in a solvent, and the solvent is vaporized by heating and baking. As a result of integrating the ceramics particles with the porous layer, the dielectric 1a is formed.

Here, the smaller the particle size of the ceramics particles in the slurry, the lower the baking temperature can be and the more accurately the ceramics particles can be dispersed in the pores of the porous layer. Therefore, the average particle size of the ceramics particles is preferably about 10 to 500 nm. Note that this average particle size is a median diameter of accumulated distribution (cumulative distribution) (particle size when a cumulative amount is 50% in a cumulative distribution curve). Further, the average particle size is measured by a dynamic light scattering method, a method using a dielectrophoresis phenomenon and diffracted light, or the like. Further, as the solvent, water, alcohol, acetone, or the like is usable.

When the glass material is used as the sealer, for instance, the pores of the porous layer are impregnated with a slurry in which fine glass particles are suspended in a solvent and the solvent is vaporized by heating and baking. As a result of integrating the glass particles and the porous layer, a sealer-filled layer is formed. Here, the smaller the particle size of the glass particles in the slurry, the lower the baking temperature can be, and further, the more accurately the glass particles can be dispersed in the pores of the porous layer. Therefore, the average particle size of the glass particles is preferably about 10 to 500 nm. Note that this average particle size is a median diameter of accumulated distribution (cumulative distribution) (particle size when a cumulative amount is 50% in a cumulative distribution curve). Further, the average particle size is measured by a dynamic light scattering method, a method using a dielectrophoresis phenomenon and diffracted light, or the like. Further, as the solvent, water, alcohol, acetone, or the like is usable.

(Evaluation of Dielectric Strength (Influence of Sealing Process))

Here, dielectric strength of the dielectric 1a was evaluated based on the measurement result of a dielectric breakdown voltage. Here, the following dielectrics 1a were used.

a dielectric 1a fabricated by a common coating process and formed of a porous layer made of a porous ceramics material a dielectric 1a fabricated by the aforesaid method and formed of a compact layer whose porosity is 10% or less a dielectric 1a formed of a sealer-filled layer which is fabricated in a manner that a porous layer made of a ceramics material is subjected to a sealing process and pores are filled with a sealer made of a dielectric material As the porous layer, a member made of alumina and having a 20 mm width, a 100 mm length, and a 250 µm thickness was used. Further, according to the result of the measurement based on image analysis of a sectional tissue of a spray deposit, porosity of the porous layer was 12%.

As the compact layer, a member made of alumina and having a 20 mm width, a 100 mm length, and a 250 µm thickness was used. Further, porosity of the compact layer was 6% according to the result of the measurement based on image analysis of a sectional tissue of a spray deposit.

As the porous layer of the sealer-filled layer, the same porous material as the aforesaid porous layer was used. As the sealer, a slurry whose main components are alumina particles with a 100 nm average particle size was used. On a deposit surface, the above slurry was applied, followed by pressure reduction, whereby voids were impregnated with the slurry and a solvent in the slurry was removed by vaporization. Then, by repeating this process a plurality of times, the alumina particles were filled in the voids near the surface. Thereafter, the resultant was heated to 500° C. to be baked in an argon gas atmosphere, whereby the sealer-filled layer was obtained.

A partial discharge start voltage was measured. The aforesaid porous layers, the compact layer and sealer-filled layer were each sandwiched by two flat metal plates made of copper and having a 10 mm width, an 80 mm length, and a 2 mm thickness, and a high voltage was applied between the both flat metal plates. Here, the dielectric breakdown voltage is a voltage when dielectric breakdown occurs as a result of a gradual increase of the voltage applied between the both flat metal plates.

Figure 9:
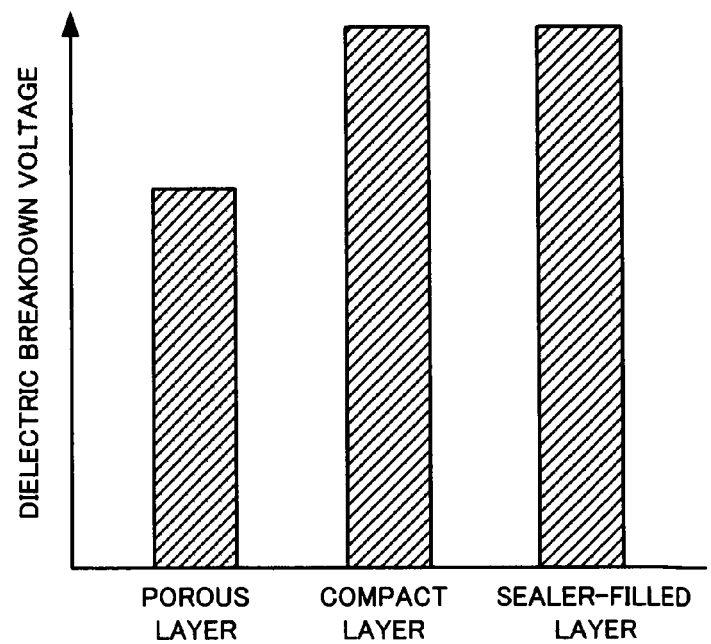
FIG. 9 is a chart showing dielectric strength of the air current generating apparatus.

FIG. 9 shows the measurement results of the partial discharge start voltage. As shown in FIG. 9, when the dielectric 1a is formed of the compact layer or the sealer-filled layer, the dielectric breakdown voltage becomes higher and the dielectric strength improves.

FIG. 10A to FIG. 10D show an eighth example of this embodiment, in which the electrodes and the dielectric are formed directly on a surface of a target object (dielectric) by EB-PVD.

Figure 10A:
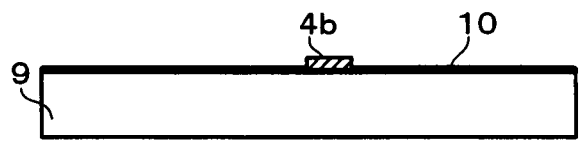
FIG. 10A is a view showing a method for forming the discharge electrode of the air current generating apparatus in an eighth example of the first embodiment.

In this example, a masking 10 is formed on the surface of the electrically insulating object 9 being an external installation target, with an area in which the counter electrode 4b is to be formed being left. Then, by EB-PVD, the counter electrode 4b is fixed in close contact on the surface of the object 9 (FIG. 10A).

Figure 10B:
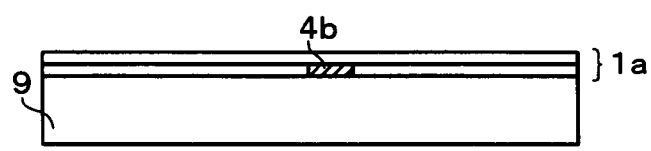
FIG. 10B is a view showing the method for forming the discharge electrode of the air current generating apparatus in the eighth example of the first embodiment.

Next, the ceramic layer (dielectric 1a) is formed on the counter electrode 4b by EB-PVD (FIG. 10B).

Figure 10C:
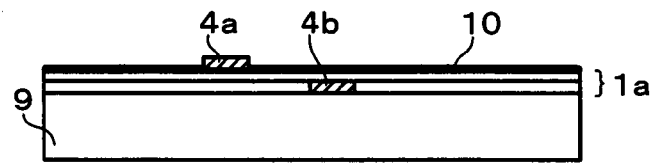
FIG. 10C is a view showing the method for forming the discharge electrode of the air current generating apparatus in the eighth example of the first embodiment.

Next, on the ceramic layer (dielectric 1a), a masking 10 is formed with an area where the discharge electrode 4a is to be formed being left. Then, the discharge electrode 4a is fixed in close contact on the surface of the dielectric 1a by EB-PVD (FIG. 10C).

Figure 10D:
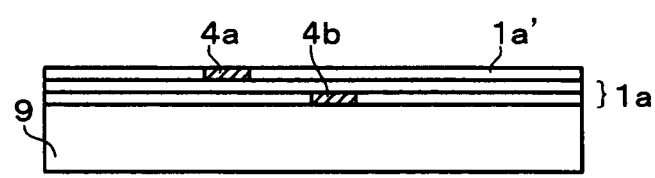
FIG. 10D is a view showing the method for manufacturing the discharge electrode of the air current generating apparatus in the eighth example of the first embodiment.

When necessary, a ceramic layer (dielectric 1a') is formed again by EB-PVD. When necessary, the surface is polished to expose the discharge electrode 4a (FIG. 10D).

In this embodiment, since the electrodes and the dielectric both can be made of ceramics, it is possible to provide an air current generating apparatus excellent in corrosion resistance and heat resistance.

Figure 11A:
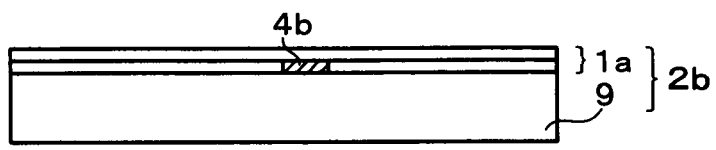
FIG. 11A is a view showing a method for forming the discharge electrode of the air current generating apparatus in a ninth example of the first embodiment.
Figure 11B:
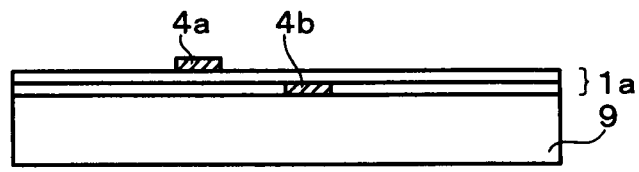
FIG. 11B is a view showing the method for forming the discharge electrode of the air current generating apparatus in the ninth example of the first embodiment.

FIG. 11A to FIG. 11B show a ninth example of this embodiment, in which the surface electrode 4a formed into a predetermined shape in advance is formed by being joined to the surface of the ceramic layer (dielectric 1a).

In this example, the covered electrode 4b and the dielectric layer 1a are formed by the method described as the eighth example in FIG. 10A to FIG. 10D, for instance (FIG. 11A).

The discharge electrode 4a formed into a predetermined shape in advance is joined directly thereon by one of the following methods (1), (2), for instance.

(1) The discharge electrode 4a is placed on the dielectric 1a via an active metal brazing and the both are joined under a high temperature.

(2) The discharge electrode 4a made of copper is placed on the dielectric 1a, and they are heated at a eutectic temperature of copper and oxygen to be joined.

In this method, the fact that the eutectic melting point of copper and oxygen is lower than a melting point of copper is used for joining. Therefore, the following process and so on are necessary. For example, a bonded surface of copper is oxidized. As ceramics, oxide-based ceramics is used. A bonded surface of nonoxide-based ceramics is oxidized. Alternatively, copper and ceramics are combined and oxygen is interposed therebetween. In these methods, it is possible to easily form the discharge electrode 4a with a large thickness.

Figure 12A:
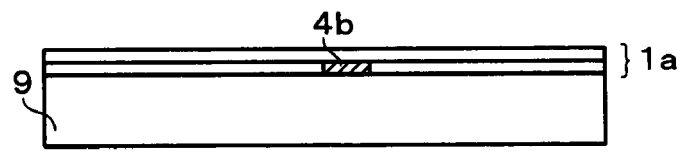
FIG. 12A is a view showing a method for forming the discharge electrode of the air current generating apparatus in a tenth example of the first embodiment.
Figure 12B:
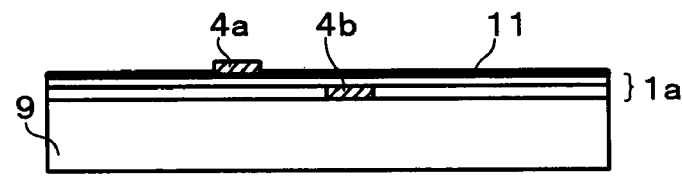
FIG. 12B is a view showing the method for forming the discharge electrode of the air current generating apparatus in the tenth example of the first embodiment.
Figure 12C:
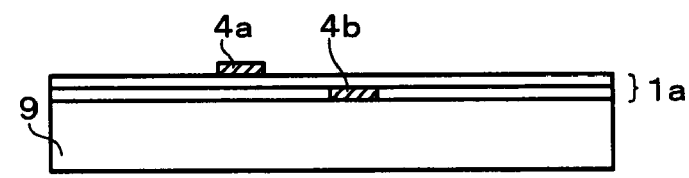
FIG. 12C is a view showing the method for forming the discharge electrode of the air current generating apparatus in the tenth example of the first embodiment.

FIG. 12A to FIG. 12C show a tenth example of this embodiment, in which the discharge electrode 4a is formed by coating such as cold spraying or shot coating.

In this example, the counter electrode 4b and the dielectric layer 1a are formed by the method described as the eighth example in FIG. 10A to FIG. 10D, for instance (FIG. 12A).

Thereon, a masking is formed with an area where the discharge electrode 4a is to be formed being left. By using an etching plate (active metal brazing) 11 as the masking, it is possible to form a complicated electrode pattern.

Thereon, soft metal powder is sprayed at a high speed by coating such as cold spraying or shot coating, and the sprayed soft metal is made to adhere on the surface of the dielectric 1a by collision heat, whereby the discharge electrode 4a is formed (FIG. 12B). The masking is peeled off, and finish machining is applied on the electrode surface when necessary (FIG. 12C).

According to this example, room-temperature machining is possible, the apparatus is also simple, and the masking is also easy.

Figure 13A:
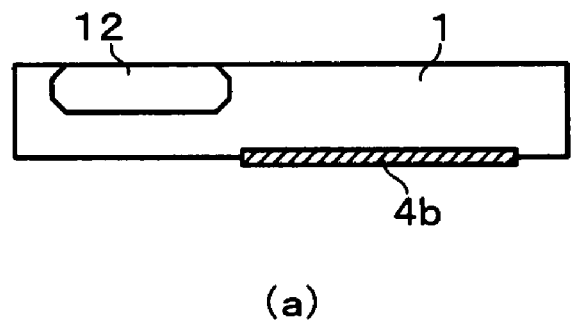
FIG. 13A is a view showing a method for forming the discharge electrode of the air current generating apparatus in an eleventh example of the first embodiment.
Figure 13B:
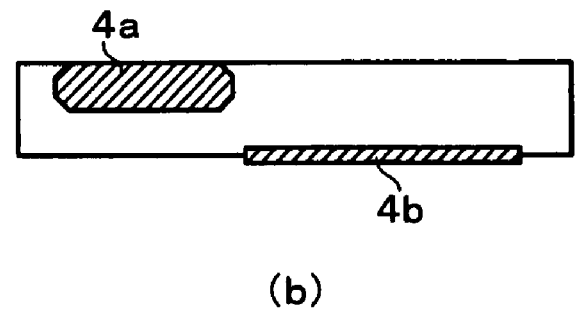
FIG. 13B is a view showing the method for forming the discharge electrode of the air current generating apparatus in the eleventh example of the first embodiment.

FIG. 13A and FIG. 13B show an eleventh example of this embodiment regarding a method for forming the discharge electrode.

In this example, first, near the surface of the dielectric 1 on which the counter electrode 4b is formed in advance (opposite surface), a hole 12 to set the discharge electrode 4 in is opened in a plane direction (FIG. 13A). The discharge electrode 4a having the same shape as that of the hole 12 is press-fitted therein, whereby the discharge electrode 4a is firmly integrated on the surface of the insulator (FIG. 13B). It is effective to cool the discharge electrode 4a to a temperature lower than that of a use environment of the air current generating apparatus 5 before the press-fitting work is performed (expansion fit). The discharge electrode 4a being a conductor cooled to low temperature and press-fitted expands when its temperature is returned to the use environment temperature, and thus is more firmly integrated.

Consequently, it is possible to prevent the formation of a gap between the discharge electrode 4a and the dielectric 1 and prevent a power loss due to an accidental discharge in the gap.

Second Embodiment

As a second embodiment, a method for forming the counter electrode 4b which is set inside the dielectric in the air current generating apparatus to face the discharge electrode 4a will be hereinafter described.

Figure 14:
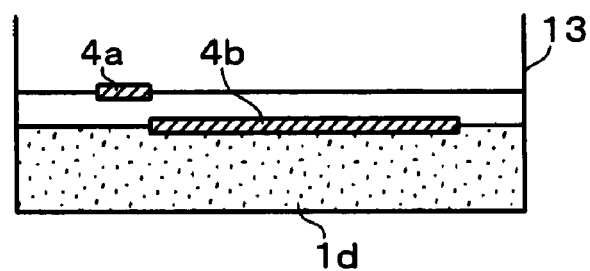
FIG. 14 is a view showing a method for forming a counter electrode of the air current generating apparatus in a second embodiment.

FIG. 14 shows one example of this embodiment regarding the method for forming the counter electrode (covered electrode) 4b that is insulation-coated.

First, a structure in which the discharge electrode 4a and the counter electrode 4b are formed on both surfaces of the dielectric 1a by, for example, the method described above in the first embodiment is prepared. Next, this structure is set in a die 13 shown in FIG. 14 with a discharge electrode 4a side facing upward, and a slurry 1d of curable liquid resin or ceramics is injected up to a level of the counter electrode 4b or higher (FIG. 14). Next, the slurry 1d is cured by heating or the like, whereby a surrounding area of the counter electrode 4b is integrated by a solid dielectric (cured substance) 1d.

Consequently, the formation of a gap between the covered electrode 4b and the dielectric 1 is prevented. As a result, it is possible to prevent a power loss due to the occurrence of an accidental discharge in the vicinity of the covered electrode 4b.

Figure 15:
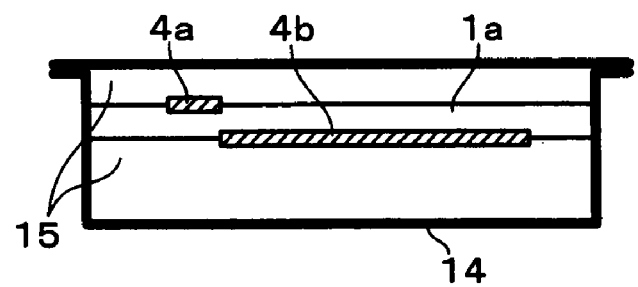
FIG. 15 is a view showing a method for forming the counter electrode of the air current generating apparatus in the second embodiment.

FIG. 15 shows an air current generating apparatus according to another example of this embodiment. A structure in which the discharge electrode 4a and the counter electrode 4b are formed by the method described in the first embodiment is disposed in an airtight vessel 14, and $SF_6$ gas 15 is filled therein.

Figure 16:
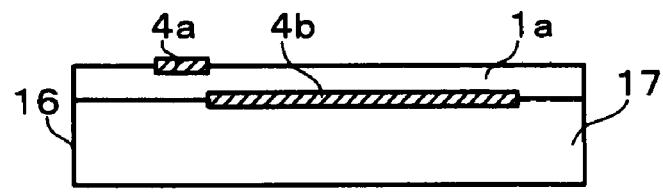
FIG. 16 is a view showing a method for forming the counter electrode of the air current generating apparatus in the second embodiment.

FIG. 16 shows an air current generating apparatus according to still another example of this embodiment. A structure in which the discharge electrode 4a and the counter electrode 4b are formed by the method described in the example 1 is disposed in a vessel 16 with a counter electrode 4b side facing downward. In this vessel 16, an insulating oil 17 is filled to a level high enough for the counter electrode 4b to be immersed therein.

In the examples shown in FIG. 15 and FIG. 14, the formation of a gap between the counter electrode 4b covered by the insulating fluid and the dielectric 1a is prevented. As a result, it is possible to prevent a power loss due to the occurrence of an accidental discharge in the vicinity of the counter electrode 4b.

Third Embodiment

As a third embodiment, a shape of the discharge electrode will be described below. Note that the dielectric 1, the discharge electrode 4a, and the covered electrode 4b shown in FIG. 17 to FIG. 23 each are in a rectangular shape having a slightly longer length than the shown width of the dielectric 1 (strip shape).

FIG. 17 to FIG. 23 show examples of the shape of the discharge electrode 4b in this embodiment. Note that the dielectric 1, the discharge electrode 4a, and the covered electrode 4b shown in FIG. 17 to FIG. 23 each are in a rectangular shape having a slightly longer length than the shown width of the dielectric 1 (strip shape).

Figure 17:
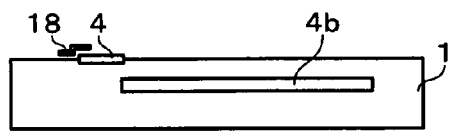
FIG. 17 is a cross-sectional view showing a shape of the discharge electrode of the air current generating apparatus in a third embodiment.

In the example shown in FIG. 17, out of end portions of the discharge electrode 4a, an end portion more distant from the counter electrode 4b is covered by an insulating sheet 18.

This insulating sheet 18 can prevent a discharge from the end portion, of the discharge electrode 4a, more distant from the counter electrode 4b to a rear surface side.

Figure 18:
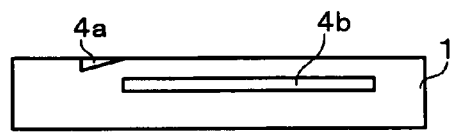
FIG. 18 is a cross-sectional view showing a shape of the discharge electrode of the air current generating apparatus in the third embodiment.

FIG. 18 shows another example of the shape of the discharge electrode 4a. The discharge electrode 4a is in a wedge shape whose end portion closer to the counter electrode 4b is thinner and whose end portion more distant from the counter electrode 4b is thicker.

Figure 19:
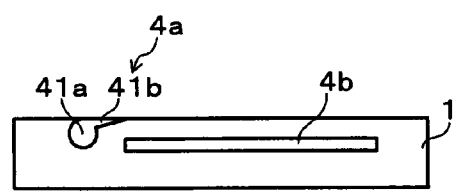
FIG. 19 is a cross-sectional view showing a shape of the discharge electrode of the air current generating apparatus in the third embodiment.

In the discharge electrode 4a in FIG. 19, a round stick 41a and a wedge 41b are joined. The wedge 41b is disposed on a counter electrode side.

Figure 20:
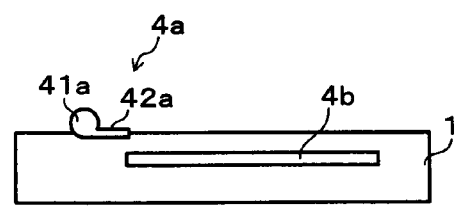
FIG. 20 is a cross-sectional view showing a shape of the discharge electrode of the air current generating apparatus in the third embodiment.

In the discharge electrode 4a in FIG. 20, a round stick 41a and an edge portion of a flat plate 42a are joined. The flat plate 42a is disposed on a counter electrode 4b side, and the round stick 41a is exposed from the dielectric 1.

Figure 21:
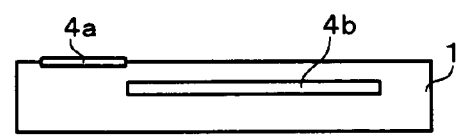
FIG. 21 is a cross-sectional view showing a shape of the discharge electrode of the air current generating apparatus in the third embodiment.

The discharge electrode 4a in FIG. 21 has a shape of a wide flat plate.

Figure 22:
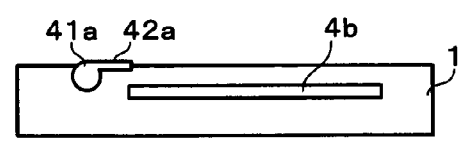
FIG. 22 is a cross-sectional view showing a shape of the discharge electrode of the air current generating apparatus in the third embodiment.

In the discharge electrode 4a in FIG. 22, a round stick 41a and an edge portion of a flat plate 42a are joined. The flat plate 42a is disposed on a counter electrode 4b side, and the round stick 41a is buried in the dielectric 1.

Figure 23:
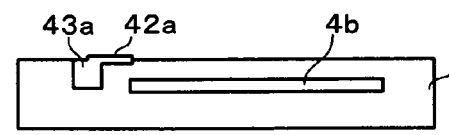
FIG. 23 is a cross-sectional view showing a shape of the discharge electrode of the air current generating apparatus in the third embodiment.

In the discharge electrode 4a in FIG. 23, an upper edge portion of a square stick 43a and an edge portion of a flat plate 42a are joined. The flat plate 42a is disposed on a counter electrode 4b side, and the square stick 43a except its upper edge portion is buried in the dielectric 1.

In FIG. 17 to FIG. 23, the counter electrode 4b-side end portion of the discharge electrode 4a has a sharp shape, so that high field intensity is formed at the time of the voltage application. As a result, it is possible to suppress an irregular discharge (for example, a discharge from the end portion, of the discharge electrode 4a, more distant from the counter electrode 4b), which makes it possible to form a stable air current.

In order for the high field intensity to be thus formed at the time of the voltage application, the counter electrode 4b-side end portion of the discharge electrode 4a has the sharp shape. The portion with the sharp shape may be exposed from the surface of the dielectric or may be covered by a thin dielectric or the like. Alternative examples of the sharp electrode shape can be a shape having irregularities at its tip such as a sawtooth shape and a trapezoidal shape, a thin blade shape such as a knife-edge, and the like.

Fourth Embodiment

FIG. 24 to FIG. 29 show examples of a fourth embodiment in which the shape of the counter electrode of the air current generating apparatus is changed according to its intended use.

Figure 24:
FIG. 24 is a cross-sectional view showing a shape of the counter electrode of the air current generating apparatus in a fourth embodiment.

FIG. 24 is an example, in this embodiment, where the covered electrode 4b is formed in a stick shape having an elliptic cross section.

Here, as the counter electrode 4b, that having a cornerless shape is used, whereby a discharge from corners is prevented when the counter electrode 4b is not completely covered. As a result, it is possible to prevent a power loss, and prevent dielectric strength of the dielectric from lowering due to a damage of the inside of the dielectric ascribable to heat generation or the generation of active species in the corner portions.

Figure 25:
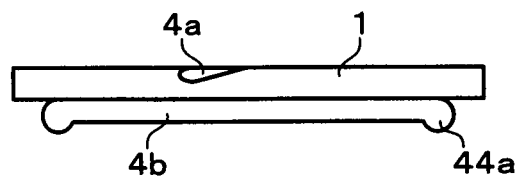
FIG. 25 is a cross-sectional view showing a shape of the counter electrode of the air current generating apparatus in the fourth embodiment.

FIG. 25 shows another example of this embodiment. The discharge electrode 4a has a cross section in a teardrop shape, and is buried in the dielectric 1 with its tip directed toward the counter electrode 4b. The counter electrode 4b is fixed so as to cover substantially the entire lower surface of the dielectric 1. Further, a rim portion of the counter electrode 4b is a round rim 44a for electric field alleviation.

In this example, even if the counter electrode 4b is not covered, the round rim 44a alleviates the concentration of the electric field on the rim portion of the counter electrode 4b. As a result, an accidental discharge in this portion can be avoided.

Figure 26:
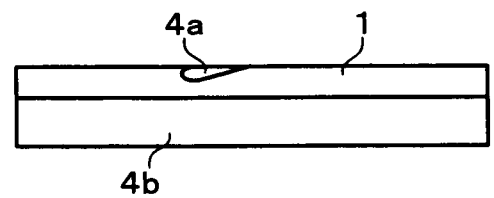
FIG. 26 is a cross-sectional view showing a shape of the counter electrode of the air current generating apparatus in the fourth embodiment.

In FIG. 26, the counter electrode 4b in FIG. 25 is replaced by a conductive object (counter electrode 4b) and the counter electrode 4b is disposed along the entire lower surface of the dielectric 1. In this example, since the conductive object (counter electrode 4b) on the lower side is large, an electric field concentrates on the tip of the teardrop shape of the discharge electrode 4a. As a result, no discharge occurs on the conductive object (counter electrode 4b) side.

In the examples shown in FIG. 25 and FIG. 26, careful attention is needed so as to bring the dielectric 1 and the counter electrode 4b on its lower surface fully into close contact to prevent the entrance of gas.

Figure 27:
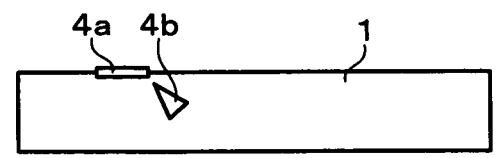
FIG. 27 is a cross-sectional view showing a shape of the counter electrode of the air current generating apparatus in the fourth embodiment.
Figure 28:
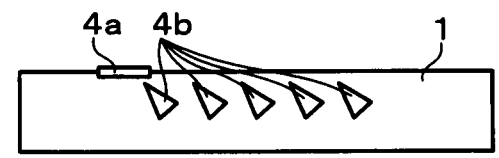
FIG. 28 is a cross-sectional view showing a shape of the counter electrode of the air current generating apparatus in the fourth embodiment.

FIG. 27 and FIG. 28 show other examples of this embodiment. In FIG. 27, the counter electrode 4b is a buried electrode buried in the dielectric 1. The counter electrode 4b has a wedge-shaped cross section and a tip of the counter electrode 4b is directed toward the discharge electrode 4a. In FIG. 28, a plurality of the counter electrodes 4b are buried substantially in parallel in the dielectric 1. The counter electrodes 4b in FIG. 28 each have the same wedge shape as that in FIG. 27.

In these examples, since the covered electrode 4b has the sharp wedge shape, it is possible to concentrate the electric field on its tip portion and localize a discharge. When the plural covered electrodes 4b are disposed at intervals as in FIG. 28, it is possible to break up an extension length of the discharge progressing from the end portion of the discharge electrode 4a. As a result, it is possible to control the air current generating apparatus in a discreet manner.

Figure 29:
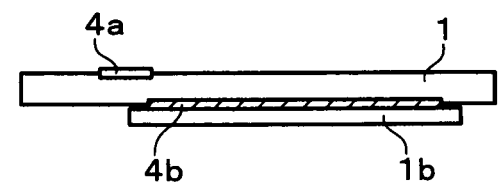
FIG. 29 is a cross-sectional view showing a shape of the counter electrode of the air current generating apparatus in the fourth embodiment.

FIG. 29 shows an example, in this embodiment, in which the covered electrode 4b is formed in a different shape. In this example, the counter electrode 4b that is not covered is coated with a dielectric coating 1b. When a dielectric constant of the dielectric coating 1b is made large, a voltage loaded on the dielectric 1 increases, and even if gas is present near the non-covered counter electrode 4a, voltage loaded on the gas becomes small. Therefore, no dielectric breakdown of the gas occurs and no discharge is generated near the gas.

Fifth Embodiment

Hereinafter, as a fifth embodiment, a method for introducing a voltage in the air current generating apparatus will be described.

FIG. 30A to FIG. 30D show examples of an air current generating apparatus using conductive posts 19a, 19b as the method for voltage introduction. The dielectrics 1a, 1b are integrally formed. The discharge electrode 4a and the counter electrode 4b are disposed across the dielectric 1a on its front surface and its rear surface respectively. The dielectric 1b is disposed to cover the counter electrode 4b.

Figure 30A:
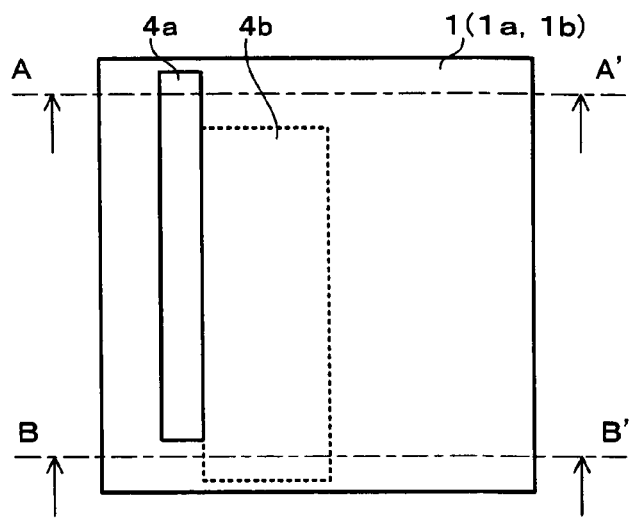
FIG. 30A is a view showing an example of the air current generating apparatus where the air current generating apparatus uses conductive posts, in a fifth embodiment.
Figure 30B:
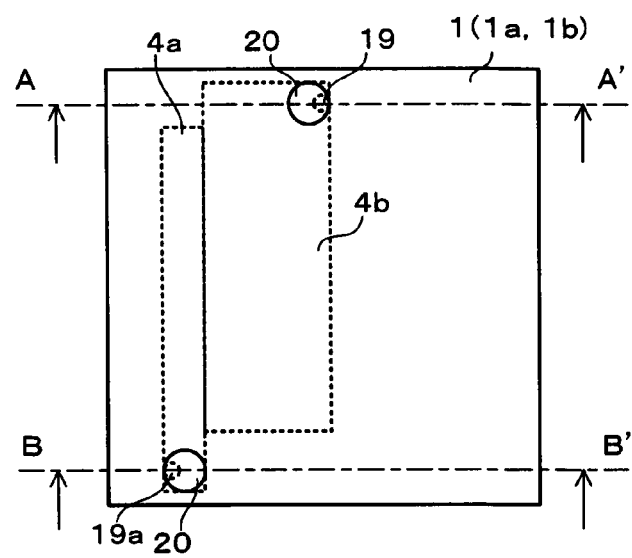
FIG. 30B is a view showing the example of the air current generating apparatus where the air current generating apparatus uses conductive posts, in the fifth embodiment.
Figure 30C:
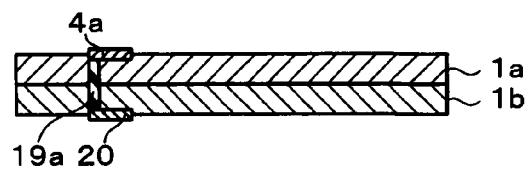
FIG. 30C is a view showing the example of the air current generating apparatus where the air current generating apparatus uses conductive posts, in the fifth embodiment.

As shown in FIG. 30C, the conductive post 19a is formed to pass through the dielectrics 1a, 1b from the discharge electrode 4a up to a contact 20 on the rear surface of the electrode. Therefore, a high-voltage cable (not shown) introducing the voltage to the discharge electrode 4a only has to be connected to the contact 20 on the rear surface, so that no disturbance occurs in an air current on an object surface.

Figure 30D:
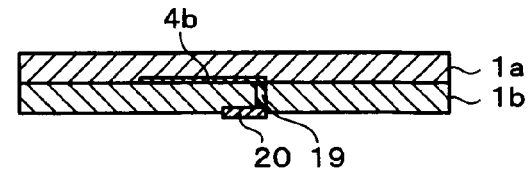
FIG. 30D is a view showing the example of the air current generating apparatus where the air current generating apparatus uses conductive posts, in the fifth embodiment.

Similarly, as shown in FIG. 30D, the conductive post 19b is formed to pass through the dielectric 1b from the covered counter electrode 4b up to a contact 20 on the rear surface of the counter electrode 4b. Therefore, a cable (not shown) connected to the covered counter electrode 4b only has to be connected to the contact 20 on the rear surface of the electrode, so that no disturbance occurs in an air current on an object surface.

A method for forming the conductive posts 19a, 19b may be, for example, a method in which conductive bars or screws are made to penetrate, but a method using a conductive paste is more effective. Through holes each having an about several μm to several hundred μm diameter are formed in the dielectric 1, and the conductive paste is filled therein for the formation. When the discharge electrode 4a and the covered counter electrode 4b are integrally formed by a method such as thermocompression bonding, a desirable method is to fill the paste prior to the heating and form the conductive posts 19a, 19b integrally with the aforesaid electrodes. The use of screen printing for filling the conductive paste is desirable in view of lowering manufacturing cost.

The diameters of the conductive posts 19a, 19b are small, and therefore, even when the conductive paste different in coefficient of thermal expansion from the dielectric 1 is used, a gap is unlikely to be formed between the conductive posts 19a, 19b and the dielectric 1 at the time of the formation and it is possible to avoid an accidental discharge in the gap and deterioration in insulation performance. Further, when a large discharge current is required, it is only necessary to increase the number of the conductive posts 19a, 19b, and thus manufacturing cost can be lowered.

Sixth Embodiment

Hereinafter, as a sixth embodiment, a description will be given of a shape of the discharge electrode for making an induced air current have uniform velocity distribution or conversely making the velocity have distribution, in the longitudinal direction of the electrode of the air current generating apparatus.

Figure 31:
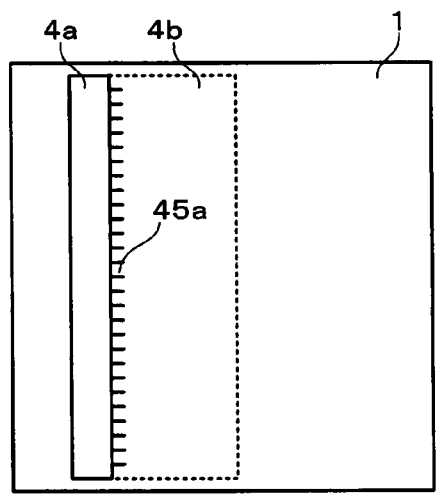
FIG. 31 is a view showing an example of the discharge electrode of the air current generating apparatus in a sixth embodiment.

FIG. 31 shows one example of this embodiment, where the shape of the discharge electrode 4a is changed. A discharge is generated on an end portion closer to the counter electrode 4b out of end portions of the discharge electrode 4a, and a conductor member 45a in a comb shape is disposed on the end portion.

At tip portions of the conductor member 45a in the comb shape, field intensity becomes high, which makes it possible to intentionally generate the discharge. Since the conductor 45a in the comb shape is disposed on the end portion of the discharge electrode 4a along its longitudinal direction, uniformity of the discharge in the longitudinal direction of the discharge electrode 4a can be ensured on the end portion of the discharge electrode 4a. As a result, on the end portion of the discharge electrode 4a, it is possible to obtain a longitudinally uniform induced air current.

Further, intervals between comb teeth of the conductor 45a in the comb shape can be irregular. In this case, on the end portion of the discharge electrode 4a, it is possible to obtain an induced-flow velocity having distribution in the longitudinal direction of the discharge electrode 4a according to the width of the intervals between the comb-teeth.

For example, in the case of a wing of an airplane or the like, separation phenomena of air currents at a wingtip and at a wing root are different. Therefore, by generating an induced-flow velocity having an optimum distribution in the longitudinal direction of each wing, it is possible to effectively control the air current.

Figure 32:
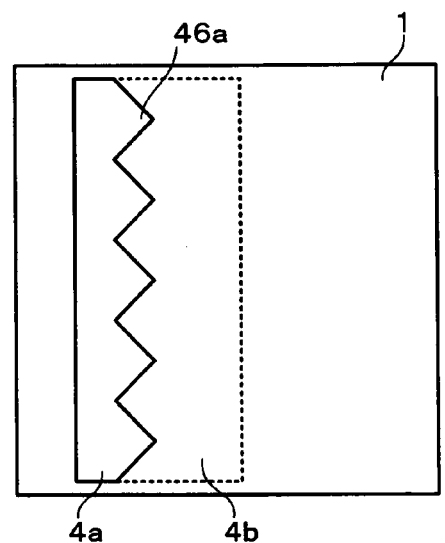
FIG. 32 is a view showing an example of the discharge electrode of the air current generating apparatus in the sixth embodiment.

FIG. 32 shows another example where the shape of the discharge electrode 4a is changed. In this example, instead of the above-described conductor 45a in the comb shape, a conductor 46a in a saw-tooth shape is used. Convex portions of the conductor in the saw-tooth shape have high field intensity and its concave portions have low field intensity. Therefore, similarly to the case where the above-described conductor 45a in the comb shape is disposed, on the end portion of the discharge electrode 4a, it is possible to obtain an induced-flow velocity having distribution in the longitudinal direction of the discharge electrode 4a according to the width of the intervals of the concavity and convexity of the saw teeth.

Figure 33:
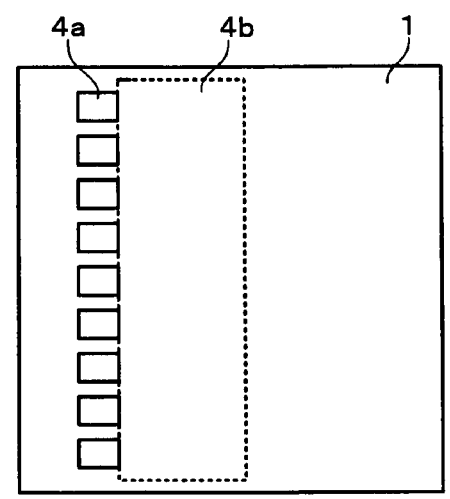
FIG. 33 is a view showing an example of the discharge electrode of the air current generating apparatus in the sixth embodiment.

FIG. 33 shows another example where the shape of the discharge electrode 4a is changed. In this example, the discharge electrode 4a is divided into a plurality of electrodes in a longitudinal direction of the electrode. By applying a high voltage independently to the plural discharge electrode 4a sides, it is possible to obtain an induced air current having distribution in the longitudinal direction of the discharge electrode 4a.

In the case of this electrode structure, by ON/OFF controlling a high-voltage switch connected to each of the discharge electrodes 4a, or by independently controlling voltage, frequency, and modulation frequency, it is possible to change the distribution in the longitudinal direction of the discharge electrode 4a not only in terms of position but also in terms of time. As a result, a control function becomes widened, and active air current control according to unsteadiness of a minute structure of a flow becomes possible.

Seventh Embodiment

Hereinafter, as a seventh embodiment, a shape of the counter electrode 4b for making velocity distribution of an induced air current uniform or conversely making the velocity have distribution, in the longitudinal direction of the discharge electrode 4a of the air current generating apparatus will be described.

Figure 34:
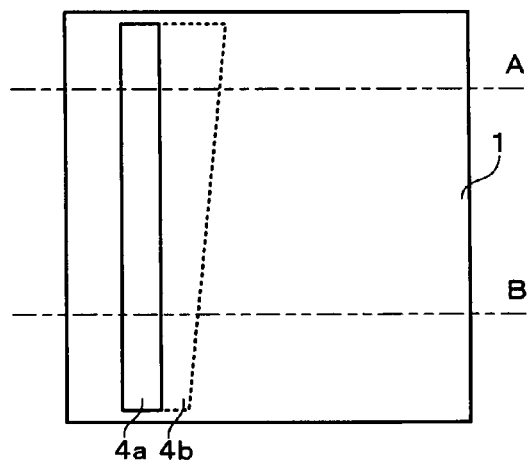
FIG. 34 is a view showing an example of a shape of the covered counter electrode of the air current generating apparatus in a seventh embodiment.

FIG. 34 shows one example of this embodiment, in which the shape of the counter electrode 4b is changed. A streamer (week discharge) occurs from an end portion of the discharge electrode 4a to pass on the surface of the dielectric. While a space-charge field that the streamer itself forms maintains its intensity, the streamer extends above the counter electrode 4b but does not extend beyond the end portion of the counter electrode 4b. Therefore, when a width of the counter electrode 4b is narrow, the extension distance of the discharge is limited and an induced-flow velocity occurring in this portion also lowers. On the other hand, when the width of the counter electrode 4b is wide, the extension distance of the discharge becomes longer and an induced-flow velocity occurring in this portion also increases.

Figure 35:
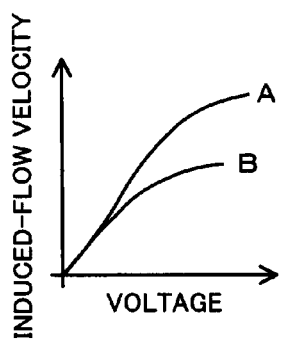
FIG. 35 is a chart showing a correlation between voltage and an induced air current of the air current generating apparatus in the seventh embodiment.

With the use of this nature, by forming the counter electrode 4b so that its width changes in the longitudinal direction of the discharge electrode 4a, it is possible to obtain an induced air current having distribution in the longitudinal direction of the discharge electrode 4a. For example, the counter electrode is formed in a trapezoidal shape as in FIG. 34. In this case, an induced-flow velocity on an A portion and an induced-flow velocity on a B portion are expressed as in FIG. 35.

Figure 36:
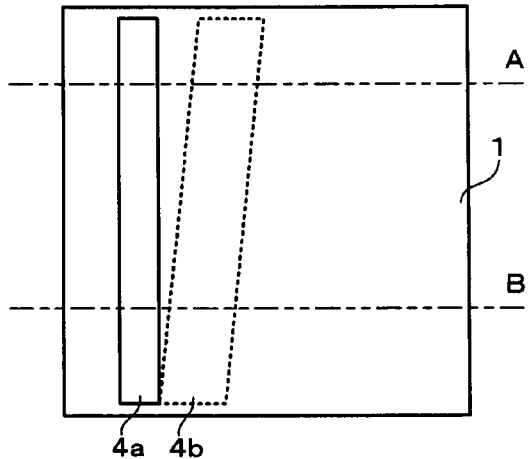
FIG. 36 is a view showing an example of the shape of the covered counter electrode of the air current generating apparatus in the seventh embodiment.
Figure 37:
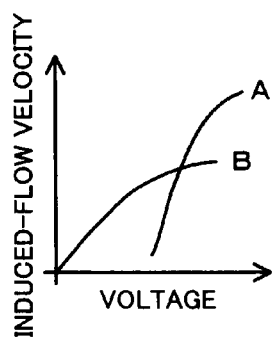
FIG. 37 is a chart showing another correlation between voltage and an induced air current of the air current generating apparatus in the seventh embodiment.

Further, as shown in FIG. 36, the counter electrode 4b is formed in a rhombus shape. In this case, no discharge occurs on the A portion if the voltage is low, but when the voltage exceeds a dielectric breakdown voltage, a discharge with a long extension distance is ignited. Therefore, the velocity of the induced air current is expressed as in FIG. 37.

Figure 38:
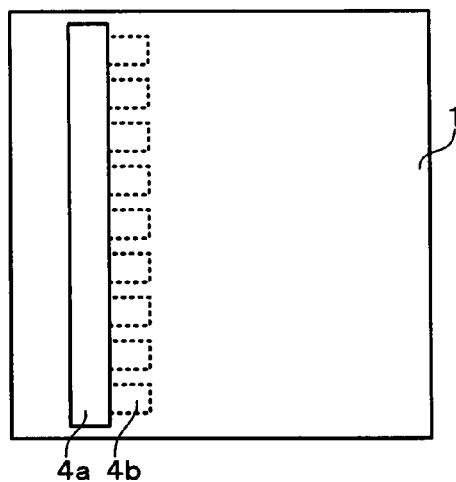
FIG. 38 is a view showing another example of the shape of the covered counter electrode of the air current generating apparatus in the seventh embodiment.

FIG. 38 shows another example in which the shape of the discharge electrode 4b is changed. In this case, the counter electrode 4b is divided into a plurality of electrodes in the longitudinal direction of the electrode. The counter electrodes 4b are connected to one end of an output of a high-voltage power source via switches respectively. When the switch is OFF, the counter electrode 4b is at a floating potential and a stable discharge is not formed. On the other hand, when the switch is turned ON, a high voltage is applied between the switch and the discharge electrode 4a and a discharge is ignited.

In the case of this electrode structure, by ON/OFF controlling the switches connected to the respective counter electrodes 4b or independently controlling voltage, frequency, and modulation frequency, it is possible to change the distribution in the longitudinal direction of the discharge electrode 4a in terms of time. As a result, active air current control according to unsteadiness of a minute structure of a flow is enabled.

Figure 39:
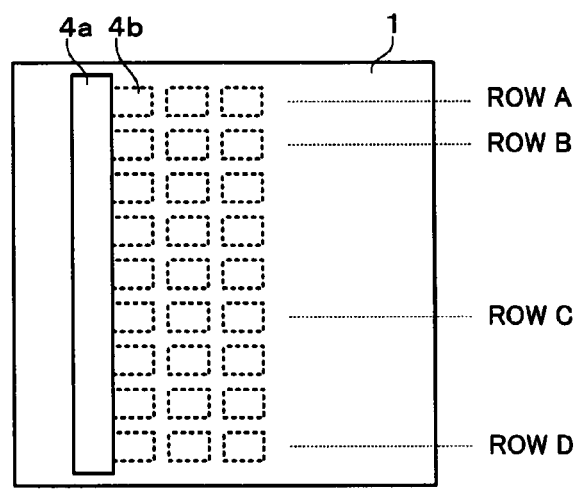
FIG. 39 is a view showing another example of the shape of the covered counter electrode of the air current generating apparatus in the seventh embodiment.
Figure 40:
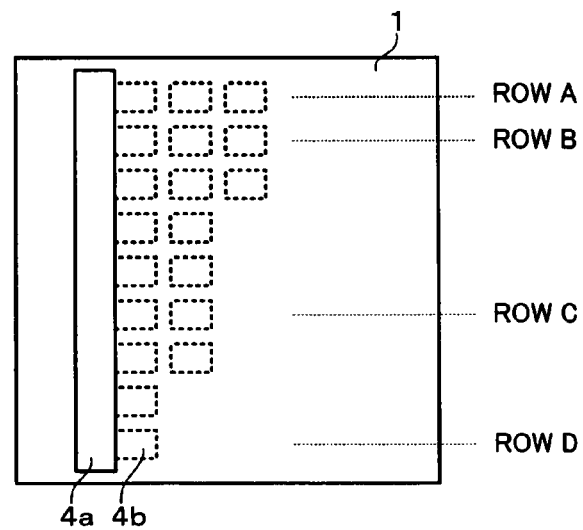
FIG. 40 is a view showing another example of the shape of the covered counter electrode of the air current generating apparatus in the seventh embodiment.

FIG. 39 and FIG. 40 show other examples in which the shape of the counter electrode 4b is changed. The counter electrode 4b is divided into electrodes arranged in matrix. The counter electrodes 4b are connected to one end of an output of a high-voltage power source via switches respectively.

When the switch is OFF, the counter electrode 4b is at a floating potential and a stable discharge is not formed. On the other hand, when the switch is turned ON, a high voltage is applied between the switch and the discharge electrode and a discharge is ignited.

In the case of this electrode structure, by ON/OFF controlling the switches connected to the respective electrodes or independently controlling voltage, frequency, and modulation frequency, it is possible to change distribution in the longitudinal direction of the discharge electrode 4 not only in terms of position but also in terms of time.

When the switches are ON/OFF controlled by the method in FIG. 38, the strength of the induced air current is changed in a single step in the longitudinal direction. On the other hand, in the method in FIG. 39, only by ON/OFF controlling the switches, the distribution in which the strength of the induced air current is changed in multisteps in the longitudinal direction of the discharge electrode 4a can be formed. As a result, more subtle active control is enabled.

The structures of the covered electrode 4b shown in FIG. 38, FIG. 39, and FIG. 40 have the following merit. That is, applying the high voltage to the discharge electrodes and grounding the counter electrode eliminates a need for a high-voltage switching element and can greatly simplify the apparatus structure.

Eighth Embodiment

Hereinafter, as an eighth embodiment, a method in which a plurality of air current generating apparatuses are arranged on a surface will be described.

Figure 41:
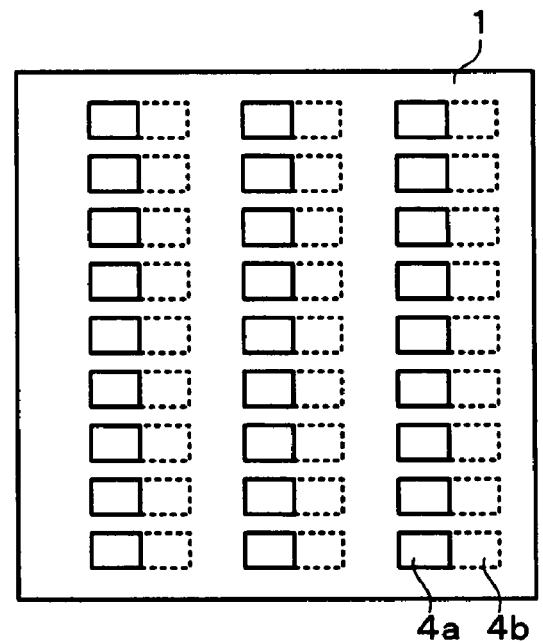
FIG. 41 is a view showing another example of a shape of the discharge electrode of the air current generating apparatus in an eighth embodiment.

FIG. 41 shows one example of this embodiment. The shape of the discharge electrode 4a is changed from those described so far. In this example, a plurality of pairs of the slip-shaped discharge electrode 4a and counter electrode 4b are arranged on the dielectric 1.

In the case of this electrode structure, by ON/OFF controlling switches connected to the respective electrode pairs, it is possible to change the distribution in the longitudinal direction of the electrode in terms of position and in terms of time, which enables active air current control according to unsteadiness of a minute structure of a flow. For example, when N×M pieces of electrodes are arranged, the air current can be controlled by N×M pieces of switches.

Figure 42:
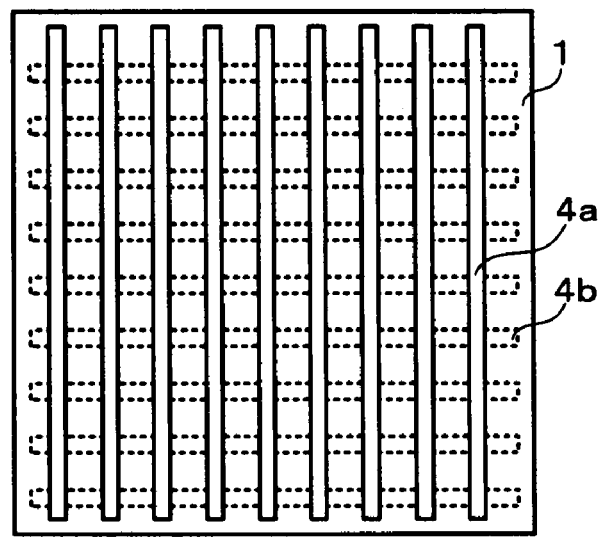
FIG. 42 is a view showing another example of the shape of the discharge electrode of the air current generating apparatus in the eighth embodiment.

FIG. 42 shows another example in which the shape of the discharge electrode is changed. In this example, the discharge electrodes 4a and the counter electrodes 4b are parallel linear conductive foils each having a narrow width, and the discharge electrodes 4a and the counter electrodes 4b are perpendicular to each other.

In such an electrode structure, by controlling the voltage application to the individual electrodes, the control for each of areas formed in the matrix is enabled. For example, if the matrix is an N×M matrix, used is an address method in which a column is designated by an N pieces of switches and a row is designated by an M pieces of switches and only an electrode at an M-th column of an N-th row is caused to discharge. In this case, only N+M pieces of the switches are necessary, which can achieve cost reduction and simpler control.

Figure 43A:
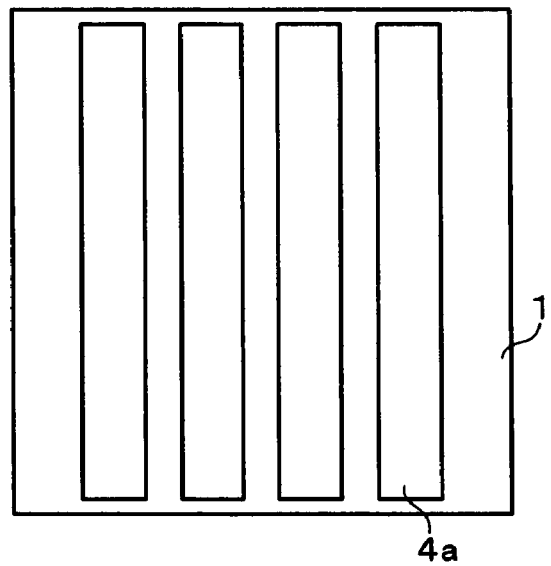
FIG. 43A is a view showing an example of a discharge electrode of the air current generating apparatus in the eighth embodiment.
Figure 43B:
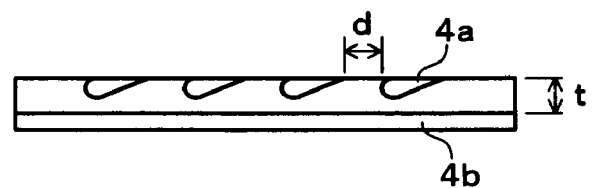
FIG. 43B is a view showing an example of a discharge electrode of the air current generating apparatus in the eighth embodiment.

FIG. 43A and FIG. 43B show another example in which the shape of the discharge electrode is changed. In this example, a plurality of electrodes each having a cross section in a teardrop shape are arranged in parallel, with sharp edge sides thereof directed in one direction, and the counter electrode 4b is a conductor plate covering the whole surface of the dielectric 1.

In this electrode structure, by ON/OFF controlling switches connected to the respective discharge electrodes 4a, it is possible to change the distribution in the longitudinal direction of the electrode in terms of time, which enables active air current control according to unsteadiness of a minute structure of a flow.

Figure 44:
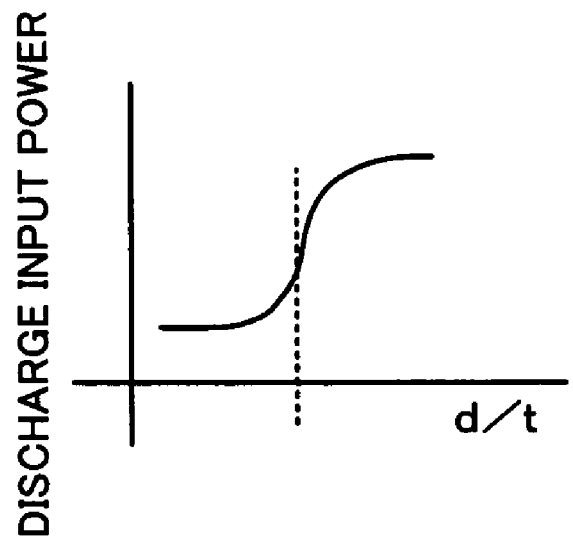
FIG. 44 is a chart showing a correlation between d/t and a discharge input power in the air current generating apparatus in the eighth embodiment.
Figure 45A:
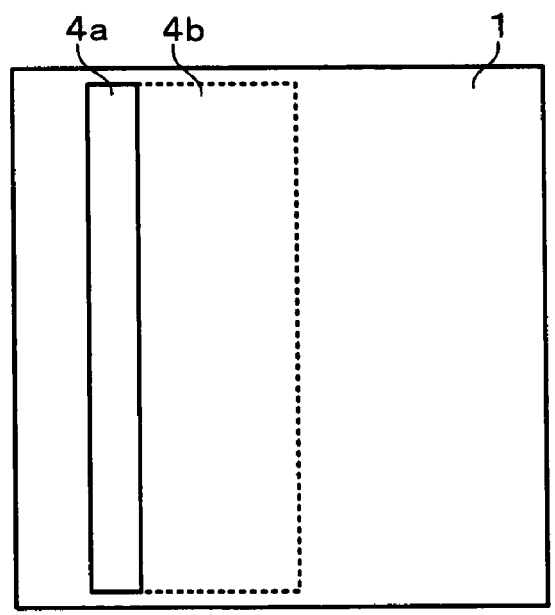
FIG. 45A is a view showing an example where a piezoelectric material is used as a dielectric of the air current generating apparatus in a ninth embodiment.
Figure 45B:
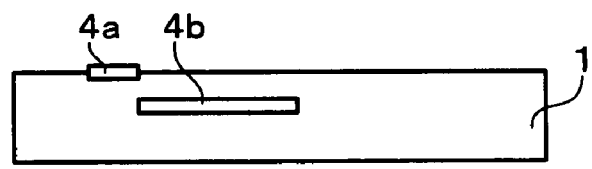
FIG. 45B is a view showing the example where the piezoelectric material is used as the dielectric of the air current generating apparatus in the ninth embodiment.

For example, in the structure in which the plural discharge electrodes are arranged as in FIG. 43A and FIG. 43B, if a gap d between the discharge electrodes is too narrow, electric fields weaken due to mutual interference, which lowers a discharge input power to the discharge electrodes. For example, a ratio d/t of the gap d between the discharge electrodes 4a to a thickness t of the dielectric 1 is set equal to or lower than a certain threshold value. By doing so, the interference of the electric fields increases, and a discharge input lowers as shown in FIG. 44. In such a case, in order to obtain the same discharge input, an excessively high voltage is required, which is disadvantageous in insulation design. For example, when the strip-shaped electrodes are arranged in parallel as in FIG. 41, the threshold value of the ratio d/t is about 1 to 10. Therefore, in the use under the ratio d/t>0.1, there is no need to apply an excessively high voltage, which is desirable.

For example, when the plural discharge electrodes are disposed in the same surface as in FIG. 41, FIG. 42, FIG. 43A, and FIG. 43B, fluid phenomena such as separation on the surface differ depending on each place. Therefore, the optimum discharge state for controlling the fluid phenomena also differs depending on each place. In particular, voltage, frequency, and modulation frequency of the discharge are important factors for the control. Setting these to different optimum values depending on each place is desirable in optimizing fluid control efficiency of the whole apparatus.

In this manner, it is possible to arrange the plural pairs of electrodes in parallel so that an area with high field intensity is formed all along a predetermined direction. In this case, a steady flow of an air current can be formed in a wide area. Further, opposed air currents are generated between the plural electrodes, and these air currents join with each other, so that it is possible to form an air current having a vertical component from the surface of the dielectric. Here, it is possible to control the direction and velocity of the air current by controlling the timings for applying the high voltage to the respective electrodes.

Ninth Embodiment

Hereinafter, as a ninth embodiment, an air current generating apparatus using a piezoelectric material as the dielectric will be described.

FIG. 45A, FIG. 45B, FIG. 46A, FIG. 46B, and FIG. 47 are examples in which a piezoelectric material is used as the dielectric 1 in an ordinary air current generating apparatus. That is, a piezoelectric element is disposed between the electrodes 4a, 4b to give oscillation to an air current. When a discharge high voltage is applied to the discharge electrode 4a disposed on the surface of the dielectric 1 (piezoelectric material) and the counter electrode 4b, a thickness of the piezoelectric material changes due to an effect of the voltage. The change in thickness of the dielectric in turn causes a change in capacitance of the dielectric.

As disclosed in JP-A2007-317656 (KOKAI), induction efficiency of an air current changes depending on the capacitance of a dielectric. Therefore, under the same discharge input, the capacitance of the dielectric when a high discharge voltage with a low frequency is applied differs from that when a low discharge voltage with a high frequency is applied. As a result, induction efficiency of the air current changes.

Figure 46A:
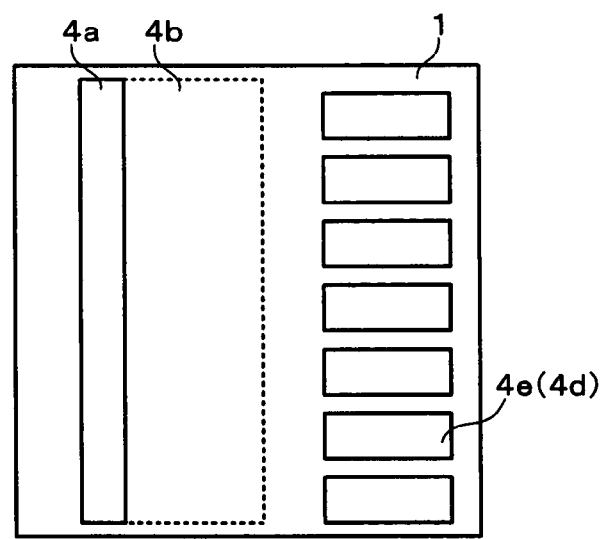
FIG. 46A is a view showing another example where a piezoelectric material is used as the dielectric of the air current generating apparatus in the ninth embodiment.
Figure 46B:
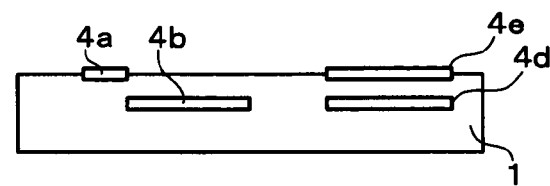
FIG. 46B is a view showing the other example where the piezoelectric material is used as the dielectric of the air current generating apparatus in the ninth embodiment.

Next, as shown in FIG. 46A and FIG. 46B, in addition to the electrodes to which the discharge high voltage is applied, piezoelectric element driving electrode pairs each composed of an A electrode 4e and a B electrode 4b for piezoelectric driving are provided. These piezoelectric element driving electrode pairs are for driving the piezoelectric element being the dielectric 1, and are disposed in plurality in a state of being divided in the longitudinal direction of the electrode, near a discharge section.

By ON/OFF controlling the piezoelectric element driving electrode pairs while the discharge high voltage is applied, it is possible to change the magnitude of the capacitance of the dielectric 1 in the longitudinal direction of the electrode. This also makes it possible to change the velocity distribution of the air current in the longitudinal direction of the discharge electrode 4a in terms of position and in terms of time.

Figure 47:
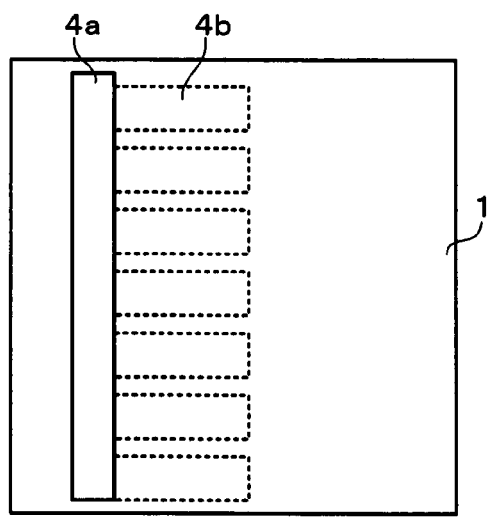
FIG. 47 is a view showing another example where a piezoelectric material is used as the dielectric of the air current generating apparatus in the ninth embodiment.

FIG. 47 is an example where the dielectric 1 is a piezoelectric substrate and no other electrode for driving the piezoelectric substrate is provided. In this example, the voltage applied between the discharge electrode 4a and the counter electrodes 4b is controlled place by place. When this voltage is equal to or lower than a discharge start voltage, the discharge electrode 4a acts as a piezoelectric substrate driving electrode. That is, a distortion of the piezoelectric substrate in proximity to the discharge electrode 4a is controlled, which influences the capacitance of the discharge electrode 4a functioning as a discharge element nearby. When this voltage is equal to or higher than the discharge start voltage, the discharge electrode 4a itself functions as the discharge element.

Tenth Embodiment

Hereinafter, as a tenth embodiment, an electrode structure of the air current generating apparatus capable of producing an induced air current in a direction perpendicular to an object surface will be described.

Figure 48:
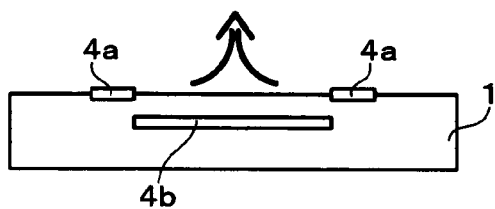
FIG. 48 is a cross-sectional view showing the structure of the air current generating apparatus in a tenth embodiment.

In FIG. 48, the two discharge electrodes 4a described so far are arranged to face each other. Induced air currents generated from end portions of the respective discharge electrodes 4a collide with each other between the two discharge electrodes 4a since their directions are opposed to each other, and thereafter these air currents change their directions upward. As a result, it is possible to obtain the induced air current perpendicular to the object surface, which makes it possible to generate an effective vertical vortex according to the control for separation and mixture.

Even when the discharge electrode is formed in a doughnut shape and the counter electrode is formed in a doughnut shape or a circular shape, a sectional structure becomes similar to that in FIG. 48, and the same effect can be expected.

At this time, it is possible to control the direction and strength of the upward flow and a discharge frequency of the vortex depending on the voltage, frequency, and modulation frequency in the opposed two discharge electrodes 4a.

Figure 49:
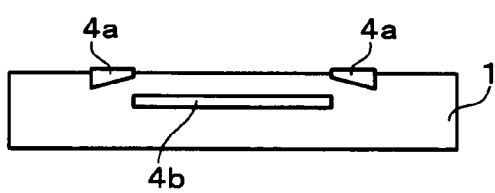
FIG. 49 is a cross-sectional view showing the structure of the air current generating apparatus in the tenth embodiment.

FIG. 49 shows an example where the two discharge electrodes 4a described in FIG. 48 each have a sharp tip. Consequently, it is possible to provide a vertical vortex generating apparatus having higher stability and durability.

Eleventh Embodiment

Figure 50:
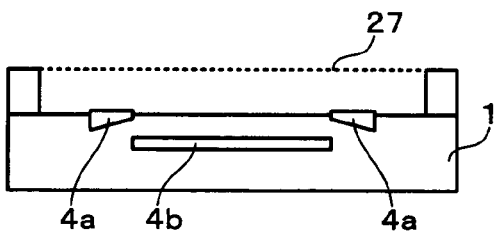
FIG. 50 is a cross-sectional view showing the structure of the air current generating apparatus in an eleventh embodiment.

FIG. 50 shows an example as an eleventh embodiment, where, in the air current generating apparatus described in the foregoing, a mesh 27 made of a conductor is put so as to cover an upper side of a spout. According to this structure, the mesh 27 made of the conductor is capable of not only preventing the adhesion of dusts to the vicinity of the discharge electrodes 4a but also removing electrical noise generated from the vicinity of the discharge electrodes 4a owing to an electromagnetic shielding effect.

Other Embodiments

Hitherto, the embodiments have been described along with the plural examples. By carrying out the structures of the embodiments and the examples in appropriate combination, it is possible to realize an air current generating apparatus synergistically exhibiting operations and effects produced by them.

Moreover, in the above-described embodiments and examples, the following modification examples can also be considered, for instance.

Since it is expected that the vicinity of the aforesaid electrode generally becomes a highly corrosive atmosphere, taking the following measure is conceivable. For example, a tracking-resistant agent such as an antioxidant or aluminum hydroxide is blended to an organic dielectric. The electrode is formed of a corrosion-resistant metal material, an oxide conductor such as ruthenium oxide, conductive ceramics such as conductive SiC, or conductive plastic. A compact substance or a porous substance is coated with a corrosion-resistant coating material. Further, an additive such as BN may be blended for ensuring strength.

Further, especially in the case of the outside use, water repellent coating is desirably applied in order to prevent an abnormal discharge due to the adhesion of water droplets to the surface of the discharge electrode. When the surfaces of the discharge electrode is coated with moisture which has high conductivity, electric field distribution becomes the same as that when the discharge electrode expands, and an induced flow occurs in an unintended direction and a power loss increases. Therefore, the surface of the discharge electrode is subjected to the water repellent coating so that water adhering on the surface can easily move. By doing so, water droplets are blown out from the surface of the electrode by a force given from a fluid flowing in contact with the surfaces, which can realize normal field electric distribution. Especially because the vicinity of the electrode becomes a highly oxidizing atmosphere, it is desirable to use oxidation-resistant water repellent coating.

Further, at a contact portion between the electrode and a high-voltage cable, it is difficult to control an air current because the electric field is disturbed. Therefore, it is desirable to supply the voltage to the electrode via a conductive post which passes through the dielectric and connected to the surface of the electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

EXPLANATION OF NUMERALS 1, 1a, 1b . . . dielectric, 1c . . . resin, 1d . . . slurry (solid dielectric), 2a, 2b . . . conductive foil, 3a, 3b . . . single-sided conductor-clad insulating plate, 4a . . . discharge electrode, 4b . . . counter electrode (covered electrode), 4d, 4e . . . piezoelectric element driving electrode, 5 . . . air current generating apparatus, 6 . . . double-sided conductor-clad insulating plate, 7 . . . molding die, 8 . . . unit block, 10 . . . masking, 11 . . . etching plate (active metal brazing), 12 . . . hole, 13 . . . die, 14 . . . airtight vessel, 15 . . . SF6 gas, 16 . . . vessel, 17 . . . insulating oil, 18 . . . insulating sheet, 19a, 19b . . . conductive post, 20 . . . contact, 27 . . . mesh made of conductor, 41a . . . round stick, 41b . . . wedge, 42a . . . flat plate, 43a . . . square stick, 44a . . . round rim, 45a . . . comb-shaped conductor, 46a . . . saw-tooth shaped conductor

What is claimed is:
1. An air current generating apparatus, comprising:
a dielectric substrate exposed to gas;
a first electrode disposed inside the dielectric substrate;
a second electrode disposed near a surface of the dielectric substrate so as to correspond to the first electrode and having a sharp shape; and
a power source applying a voltage between the first and second electrodes and plasmatizing part of the gas to generate an air current.

2. The air current generating apparatus according to claim 1,
wherein field intensity between the first and second electrodes differs in a longitudinal direction of the first and second electrodes.

3. The air current generating apparatus according to claim 1,
wherein the second electrode has a plurality of electrodes; and
wherein the plural electrodes are arranged so as to cause an area having high field intensity to be formed all along a predetermined direction when the voltage is applied.

4. The air current generating apparatus according to claim 1,
wherein the second electrode has a plurality of electrodes; and
wherein the plural electrodes are arranged so as to cause areas having high field intensity to be formed along a plurality of different directions when the voltage is applied.

5. The air current generating apparatus according to claim 1,
wherein the second electrode has a plurality of electrodes; and
wherein the plural electrodes are arranged so as to cause opposed air currents to be generated between the plural electrodes when the voltage is applied and join with each other to become an air current having a vertical component from the surface of the dielectric substrate.

6. The air current generating apparatus according to claim 1,
wherein the second electrode has a plurality of electrodes; and
wherein the power source applies the voltage to the plural electrodes at different timings respectively.

7. The air current generating apparatus according to claim 1,
wherein the second electrode has a plurality of electrodes; and
wherein the power source applies voltages with different frequencies to the plural electrodes respectively.

8. The air current generating apparatus according to claim 1,
wherein the second electrode has a plurality of electrodes; and
wherein the power source applies voltages whose frequencies are differently modulated to the plural electrodes respectively.

9. The air current generating apparatus according to claim 1,
wherein a surface of the dielectric substrate or the second electrode is covered by at least one of a corrosion-resistant material and a water-repellent material.

10. The air current generating apparatus according to claim 1, further comprising,
a conductive post electrically connecting at least one of the first and second electrodes to the power source, and passing through the dielectric substrate to be connected to one of the first and second electrodes.

* * * * *